(12) United States Patent
Chandrakasan et al.

(10) Patent No.: US 11,018,526 B2
(45) Date of Patent: May 25, 2021

(54) DETUNING FOR A RESONANT WIRELESS POWER TRANSFER SYSTEM INCLUDING COOPERATIVE POWER SHARING

(71) Applicant: Massachusetts Institute of Technology, Cambridge, MA (US)

(72) Inventors: Anantha P. Chandrakasan, Belmont, MA (US); Nachiket V. Desai, Cambridge, MA (US); Chiraag Juvekar, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 312 days.

(21) Appl. No.: 15/892,155

(22) Filed: Feb. 8, 2018

(65) Prior Publication Data
US 2019/0245384 A1    Aug. 8, 2019

(51) Int. Cl.
*H02J 50/12* (2016.01)
*H02J 50/05* (2016.01)
*H03K 7/08* (2006.01)

(52) U.S. Cl.
CPC .............. *H02J 50/12* (2016.02); *H02J 50/05* (2016.02); *H03K 7/08* (2013.01)

(58) Field of Classification Search
None
See application file for complete search history.

(56) References Cited

U.S. PATENT DOCUMENTS

| | | | |
|---|---|---|---|
| 5,608,306 A | 3/1997 | Rybeck et al. | |
| 6,100,663 A | 8/2000 | Boys et al. | |
| 6,844,755 B2 | 1/2005 | Ajit | |
| 6,975,092 B2 | 12/2005 | Edington et al. | |
| 7,276,857 B2 | 10/2007 | Logsdon et al. | |
| 7,474,062 B2 | 1/2009 | Boys et al. | |
| 7,522,878 B2 | 4/2009 | Baarman | |
| 7,605,496 B2 | 10/2009 | Stevens et al. | |
| 7,633,235 B2 | 12/2009 | Boys | |
| 7,639,514 B2 | 12/2009 | Baarman | |
| 7,675,197 B2 | 3/2010 | Tetlow | |
| 7,781,916 B2 | 8/2010 | Boys | |

(Continued)

FOREIGN PATENT DOCUMENTS

| | | |
|---|---|---|
| CN | 103346591 A | 10/2013 |
| WO | WO 01/03288 A1 | 1/2001 |

(Continued)

OTHER PUBLICATIONS

"An Actively Detuned Wireless Power Receiver With Public Key Cryptographic Authentication and Dynamic Power Allocation", Journal of Solid-State Circuits, vol. 53 Issue 1, by Desai et al. (Year: 2017).*

(Continued)

*Primary Examiner* — Jared Fureman
*Assistant Examiner* — Joel Barnett
(74) *Attorney, Agent, or Firm* — Daly, Crowley, Mofford & Durkee, LLP

(57) ABSTRACT

Wireless resonant inductive power receivers for achieving detuning for a resonant wireless power transfer system including cooperative power sharing is described. Cooperative power sharing allows for detuning one or more wireless received coupled to a wireless charger to alter the power received at each wireless receiver.

17 Claims, 11 Drawing Sheets

(56) References Cited

U.S. PATENT DOCUMENTS

| | | | |
|---|---|---|---|
| 8,050,068 B2 | 11/2011 | Hussmann et al. | |
| 8,076,801 B2 | 12/2011 | Karalis et al. | |
| 8,093,758 B2 | 1/2012 | Hussmann et al. | |
| 8,183,938 B2 | 5/2012 | Boys et al. | |
| 8,290,649 B2 | 10/2012 | Iwashita et al. | |
| 8,294,555 B2 | 10/2012 | Tetlow | |
| 8,667,452 B2 | 3/2014 | Verghese et al. | |
| 9,077,261 B2 | 7/2015 | Yamamoto | |
| 9,130,388 B2 * | 9/2015 | Matsui | H02J 5/005 |
| 9,287,719 B2 | 3/2016 | Katsunaga et al. | |
| 9,768,732 B2 | 9/2017 | Briffa et al. | |
| 9,819,272 B2 | 11/2017 | Perreault et al. | |
| 9,825,484 B2 * | 11/2017 | Van Bosch | H02J 50/005 |
| 10,038,461 B2 | 7/2018 | Briffa et al. | |
| 10,164,472 B2 | 12/2018 | Chandrakasan et al. | |
| 2006/0274469 A1 | 12/2006 | Nielsen | |
| 2008/0067874 A1 | 3/2008 | Tseng | |
| 2008/0298100 A1 * | 12/2008 | Esaka | H04B 5/0087 363/67 |
| 2009/0174263 A1 | 7/2009 | Baarman et al. | |
| 2009/0302933 A1 | 12/2009 | Boys et al. | |
| 2010/0045114 A1 | 2/2010 | Sample et al. | |
| 2010/0148723 A1 | 6/2010 | Cook et al. | |
| 2011/0090723 A1 | 4/2011 | Hu et al. | |
| 2011/0117860 A1 | 5/2011 | Kimball | |
| 2011/0193417 A1 | 8/2011 | Hirasaka et al. | |
| 2011/0234011 A1 | 9/2011 | Yi et al. | |
| 2011/0241437 A1 | 10/2011 | Kanno | |
| 2011/0248571 A1 | 10/2011 | Kim et al. | |
| 2011/0254379 A1 | 10/2011 | Madawala | |
| 2011/0266882 A1 | 11/2011 | Yamamoto et al. | |
| 2011/0299313 A1 | 12/2011 | Hussmann et al. | |
| 2011/0304216 A1 * | 12/2011 | Baarman | H02J 50/90 307/104 |
| 2012/0002446 A1 | 1/2012 | Madawala et al. | |
| 2012/0038220 A1 | 2/2012 | Kim et al. | |
| 2012/0049640 A1 | 3/2012 | Ichikawa et al. | |
| 2012/0049642 A1 | 3/2012 | Kim et al. | |
| 2012/0091989 A1 | 4/2012 | Uramoto et al. | |
| 2012/0146425 A1 | 6/2012 | Lee et al. | |
| 2012/0161538 A1 | 6/2012 | Kinoshita et al. | |
| 2012/0223590 A1 | 9/2012 | Low et al. | |
| 2012/0242164 A1 | 9/2012 | Teggatz et al. | |
| 2012/0242284 A1 | 9/2012 | Wheatley, III et al. | |
| 2012/0306284 A1 | 12/2012 | Lee et al. | |
| 2012/0306285 A1 | 12/2012 | Kim et al. | |
| 2013/0033118 A1 * | 2/2013 | Karalis | H02J 50/12 307/104 |
| 2013/0070621 A1 | 3/2013 | Marzetta et al. | |
| 2013/0076154 A1 | 3/2013 | Baarman et al. | |
| 2013/0093390 A1 | 4/2013 | Partovi | |
| 2013/0099807 A1 | 4/2013 | Wheeland et al. | |
| 2013/0113299 A1 | 5/2013 | Von Novak et al. | |
| 2013/0181536 A1 | 7/2013 | Bhargawa et al. | |
| 2013/0207468 A1 | 8/2013 | Wu et al. | |
| 2013/0229065 A1 | 9/2013 | Robertson et al. | |
| 2013/0272044 A1 | 10/2013 | Boys et al. | |
| 2013/0300357 A1 | 11/2013 | Mercier et al. | |
| 2013/0310630 A1 | 11/2013 | Smith et al. | |
| 2014/0021795 A1 | 1/2014 | Robertson et al. | |
| 2014/0028110 A1 | 1/2014 | Petersen et al. | |
| 2014/0097791 A1 | 4/2014 | Lisuwandi | |
| 2014/0159500 A1 | 6/2014 | Sankar et al. | |
| 2015/0180265 A1 | 6/2015 | Chiang et al. | |
| 2015/0200601 A1 | 7/2015 | Sagneri et al. | |
| 2015/0236757 A1 | 8/2015 | Lee et al. | |
| 2015/0244341 A1 * | 8/2015 | Ritter | H02J 50/12 307/104 |
| 2015/0333800 A1 | 11/2015 | Perry et al. | |
| 2016/0043562 A1 | 2/2016 | Lisi et al. | |
| 2016/0043590 A1 | 2/2016 | Ha et al. | |
| 2016/0064143 A1 * | 3/2016 | Dai | H02J 7/025 320/108 |
| 2016/0064997 A1 | 3/2016 | Hur et al. | |
| 2017/0040831 A1 | 2/2017 | Desai et al. | |
| 2017/0118543 A1 | 4/2017 | Ha et al. | |
| 2017/0126071 A1 | 5/2017 | Aioanei | |
| 2019/0165573 A9 | 5/2019 | Perreault et al. | |

FOREIGN PATENT DOCUMENTS

| | | |
|---|---|---|
| WO | WO 2009/111597 A2 | 9/2009 |
| WO | WO 2009/111597 A3 | 9/2009 |
| WO | WO 2009/149464 A2 | 12/2009 |
| WO | WO 2012/037279 A1 | 3/2012 |
| WO | WO 2012/112703 A1 | 8/2012 |
| WO | WO 2013/059300 A2 | 4/2013 |
| WO | WO 2013/006068 A1 | 10/2013 |

OTHER PUBLICATIONS

Notice of Allowance dated Aug. 21, 2019 for U.S. Appl. No. 15/223,378; 20 Pages.

U.S. Appl. No. 15/892,158, filed Feb. 8, 2018, Chandrakasan, et al.

Desai, et al.; "A Resonant Receiver with Maximum-Efficiency Tracking for Device-to-Device Wireless Charging;" 2.02; MTL Annual Research Conference 2016, Session 2: Circuits and Systems; Poster and Abstract; Jan. 21, 2016; 2 Pages.

Desai et al., "A ZVS Resonant Receiver with Maximum Efficiency Tracking for Device-To-Device Wireless Charging," $42^{nd}$ European Solid-State Circuits Conference (ESSCIRC); Sep. 2016; 4 Pages.

Desai, et al.; "A Resonant Receiver with ZVS and Maximum Efficiency Tracking for Device-to-Device Wireless Charging;" MTL Center for Integrated Circuits and Systems (CICS); PowerPoint Presentation/Research Review; Nov. 4, 2015; 17 Pages.

Desai, et al.; "An Actively Detuned Wireless Power Receiver with Public Key Cryptographic Authentication and Dynamic Power Allocation"; IEEE Journal of Sold-State Circuits; vol. 53; No. 1; Jan. 1, 2018; 11 Pages.

Desai; "Circuits for Efficient and Secure Power Delivery in Distributed Applications"; Massachusetts Institute of Technology; Thesis; Feb. 1, 2017; 96 Pages.

Desai, et al.; "Device-to-Device Wireless Charging with Maximum Efficiency Tracking;" MIT Wireless Workshop 2015; Poster; Mar. 20, 2015; 1 Page.

Desai, et al.; "Energy-Efficient Wireless Power Transmitters and Receivers;" MTL Annual Research Report 2015; http://www.mtl.mit.edu/research/annual_reports/2015/circuits.pdf; Aug. 1, 2015; 1 Page.

Jin, et al.; "Rapid Wireless Charging with an Energy-Constrained Source;" SuperURP; MIT, EECS; Poster Displayer at Poster Session Dec. 6, 2012; 1 page.

Jin, et al.; "Wirelessly Charging Portable Electronics Using Mobile Devices;" Power Point Presentation; http://video.mit.edu/watch/wireless-charging-with-an-energy-constrained-source-presented-by-superurop-student-rui-jin-13573/; Jan. 17, 2013; 9 pages.

Kendir, et al.; "An Optimal Design Methodology for Inductive Power Link With Class-E Amplifier;" IEEE Transactions on Circuits and Systems—I: Regular Papers; vol. 52; No. 5; May 2005; pp. 857-866; 10 pages.

Kim, et al.; "Design of a Contactless Battery Charger for Cellular Phone;" IEEE Transactions on Industrial Electronics; vol. 48; No. 6; Dec. 2001; pp. 1238-1247; 10 pages.

Li, et al.; "A Maximum Efficiency Point Tracking Control Scheme for Wireless Power Transfer Systems Using Magnetic Resonant Coupling;" IEEE Transactions on Power Electronics; vol. 30; No. 7; Jul. 1, 2015; 11 pages.

National Institute of Standards and Technology (NIST), "Digital Signature Standard (DSS)," Information Technology Laboratory; Document FIPS PUB 186-4, Federal Information Processing Standards Publication; Jul. 2013; 130 Pages.

New York Times; "Push for Standard Cellphone Charger Gains Ground;" Article in http://www.nytimes.com/2009/02/17/technology/17iht-chargers.4.20250284.html?_r=0 published on Nov. 7, 2009; 1 Page.

PCT International Preliminary Report dated Feb. 15, 2018 for International Application No. PCT/US2016/045082; 12 Pages.

(56) References Cited

OTHER PUBLICATIONS

PCT International Search Report and Written Opinion dated Apr. 23, 2015 for International Application No. PCT/US2014/066268; 9 Pages.
PCT International Preliminary Report on Patentability dated Jun. 7, 2016 for International Application No. PCT/US2014/066268; 6 Pages.
PCT Search Report and Written Opinion of the ISA for PCT/US/2012/060590 dated Apr. 15, 2013 (WO 2013/059300 A2); 10 pages.
PCT Search Report of the ISA for PCT Appl. No. PCT/US2016/045082 dated Oct. 21, 2016; 3 pages.
PCT Written Opinion of the ISA for PCT Appl. No. PCT/US2016/045082 dated Oct. 21, 2016; 10 pages.
PCT International Search Report and Written Opinion dated May 8, 2019 for International Application No. PCT/US19/15814; 9 Pages
Sokal; "Class-E Switching-Mode High-Efficiency Tuned RF/Microwave Power Amplifier: Improved Design Equations;" Microwave Symposium Digest; IEEE MTT-S International; pp. 779-782; vol. 2; Jun. 1, 2000; 4 pages.
Wang, et al.; "Design and Analysis of an Adaptive Transcutaneous Power Telemetry for Biomedical Implants;" IEEE Transactions on Circuits and Systems—I: Regular Papers; vol. 52; No. 10; Oct. 1, 2005; pp. 2109-2117; 9 pages.
Restriction Requirement dated May 29, 2018 for U.S. Appl. No. 15/223,378; 7 Pages.
Response to Restriction Requirement dated May 29, 2018 for U.S. Appl. No. 15/223,378; Response filed Jul. 12, 2018; 1 Page.
U.S. Non-Final Office Action dated Oct. 18, 2018 for U.S. Appl. No. 15/223,378; 23 Pages.
Response to U.S. Non-Final Office Action dated Oct. 18, 2018 for U.S. Appl. No. 15/223,378; Response filed Jan. 14, 2019; 13 Pages.
U.S. Final Office Action dated Mar. 26, 2019 for U.S. Appl. No. 15/223,378; 17 Pages.
Response to U.S. Final Office Action dated Mar. 26, 2019 for U.S. Appl. No. 15/223,378; Response and RCE filed on Jun. 24, 2019; 14 Pages.
U.S. Non-Final Office Action dated Oct. 5, 2017 for U.S. Appl. No. 14/911,599; 15 Pages.
Response to U.S. Non-Final Office Action dated Oct. 5, 2017 for U.S. Appl. No. 14/911,599; Response filed Dec. 18, 2017; 12 Pages.
U.S. Final Office Action dated Feb. 6, 2018 U.S. Appl. No. 14/911,599; 8 Pages.
Response to U.S. Final Office Action dated Feb. 6, 2018 U.S. Appl. No. 14/911,599; Response filed on Aug. 6, 2018; 7 Pages.
Notice of Allowance dated Aug. 30, 2018 for U.S. Appl. No. 14/911,599; 5 Pages.
Ahn et al. "Effect of Coupling Between Multiple Transmitters or Multiple Receivers on Wireless Power Transfer", IEEE Transactions on Industrial Electronics, vol. 60 No. 7, Jul. 2013, 12 pages.
AirFuel Resonant Wireless Power Transfer (WPT) System Baseline System Specification (BSS), AirFuel Alliance, May 3, 2017, 88 pages.
Azarderakhsh et al. "Efficient Algorithm and Architecture for Elliptic Curve Cryptography for Extremely Constrained Secure Applications", IEEE Transactions on Circuits and Systems.l: Regular Papers, vol. 61, No. 4, Apr. 2014, 12 pages.
Baker et al. "Feedback Analysis and Design of RF Power Links for Low-Power Bionic Systems" IEEE Transactions on Biomedical Circuits and Systems, vol. 1, No. 1 Mar. 2007, 11 pages.
Batina et al. "An Elliptic Curve Processor Suitable for RFID-Tags" Nov. 2016, 17 pages.
Bernstein et al. "Analysis and Optimization of Elliptic-Curve Single-Scalar Multiplication," Contemporary Mathematics, vol. 461, No. 461, Jan. 2008, 19 pages.
Beth et al. "Algorithm engineering for public key algorithms," IEEE Journal on Selected Areas in Communication, vol. 7, No. 4, May 1989, 9 pages.
Texas Instruments "BQ26100 SHA-J/HMAC Based Security and Authentication IC With SDQ Interface", Jun. 2006, 29 pages.
Cannon et al. "Magnetic resonant coupling as a potential means for wireless power transfer to multiple small receivers", IEEE, Transactions om power Electronics, vol. 24, Jul. 2009, 7 pages.
Casanova et al. "A loosely coupled planar wireless power system for multiple receivers," IEEE, Transactions on industrial Electronics, vol. 56. No. 8, Aug. 2009, 9 pages.
Cheng et al. "A 6.78 MHz 6 W Wireless Power Receiver with a 3-level 1×/ 1/2× 10× Reconfigurable Resonant Regulating Rectifier", IEEE, International Solid-State Circuits Conference Jan./Feb. 2016, 3 pages.
Choi et al, "A Current-Mode Wireless Power Receiver with Optimal Resonant Cycle Tracking for Implantable Systems," IEEE Int. Solid-State Circuits Conference (ISSCC) Dig. Tech. Papers, Jan./Feb. 2016, 3 pages.
Desai et al. "A ZVS Resonant Receiver with Maximum Efficiency Tracking for Device-To-Device Wireless Charging", IEEE, Solid-State Circuits Conf. (ESSCIRC), Sep. 2016, 4 pages.
Desai et al. "An Actively Detuned Wireless Power Receiver with Public Key Cryptographic Authentication and Dynamic Power Allocation", IEEE International Solid-State Circuits Conference, Sep. 7, 2017, 3 pages.
Desai "Circuits for Efficient and Secure Power Delivery in Distributed Applications", Massachusetts Inst. Technology, Feb. 2017, 167 pages.
Dietz "Battery Authentication for Portable Power Supplies", Power Electron. Technology, vol. 32, No. 4, Apr. 2006, 8 paged.
Digital Signature Standard (DSS), document FIPS PUB 186-4, NIST, Jul. 2013, 130 pages.
Doughty et al. "A General Discussion of Li Ion Battery Safety", Electrochem. Soc. Interface. vol. 21. No. 2, Jun. 2012, 8 pages.
Furtner et al. "BIF-Battery interface Standard for Mobile Devices." in Proc. Custom Integrated Circuits Conf. (CICC). Sep. 2013, 8 pages.
Hwang et al. "An All-In-One (Qi, PMA and A4WP) 2.5 W Fully Integrated Wireless Battery Charger IC for Wearable Applications", IEEE Int. Solid-State Circuits Conf. (ISSCC) Dig. Tech. Papers, Jan./Feb. 2016, 3 pages.
Juvekar et al. "A Keccak-Based Wireless Authentication Tag with Per-Query Key Update and Power-Glitch Attack Countermeasures," in IEEE Int. Solid-State Circuits Conf. (ISSCC) Dig. Tech. Papers. Jan./Feb. 2016, 3 pages.
Kurs et al. "Wireless Power Transfer Via Strongly Coupled Magnetic Resonances", Science, vol. 317, No. 5834, Jul. 2007, 5 pages.
Lee et al. "Efficient Power-Analysis-Resistant Dual-Field Elliptic Curve Cryptographic Processor Using Heterogeneous Dual-Processing-Element Architecture", IEEE Transactions on Very Large Scale Integration (VL5I) Syst., vol. 22, No. I, Jan. 2014, 13 pages.
Li et al. "Wireless Power Transfer System Using Primary Equalizer for Coupling- and Load-Range Extension in Bio-Implant Applications," in IEEE Int. Solid-State Circuits Conference (ISSCC) Dig. Tech. Papers, Feb. 2015, 3 pages.
Moh et al. "A Fully Integrated 6W Wireless Power Receiver Operating at 6.78 MHz with Magnetic Resonance Coupling", IEEE, International Solid-State Circuits Conference (ISSCC) Dig. Tech. Papers, Feb. 2015. 3 pages.
Pessl et al. "Curved Tags-A Low-Resource ECDSA Implementation Tailored for RFID", in Proc. lilt. Workshop Radio Freq. Identification. , Secur. Privacy Issues (RFIDSec), Nov. 15, 2014, 17 pages.
Reyhani-Masoleh "Efficient Algorithms and Architectures for Field Multiplication Using Gaussian Normal bases", IEEE Transactions on Computers, vol. 55, No. I, Jan. 2006, 14 pages.
Roy et al. "Lightweight Coprocessor for Koblitz Curves: 283-Bit ECC including Scalar Conversion with Only 4300 Gates", in Proc. Cryptography Hardw. Embedded Syst., Sep. 2015, 21 pages.
Solinas "Efficient Arithmetic on Koblitz Curves", in Towards 702 a Quarter-Century Public Key Cryptography, Boston, MA, USA: Springer, Mar. 2000, 55 pages.
E. Wenger, "Hardware Architectures for MSP430-Based Wireless Sensor Nodes Performing Elliptic Curve Cryptography", in Proc. Int. Conf. Appl. Cryptograph. Netw. Secur., Jun. 2013, 17 pages.
Xing et al. "Battery Management Systems in Electric and Hybrid Vehicles", Energies, vol. 4, No. 11, Oct. 31, 2011, 18 pages.

(56) References Cited

OTHER PUBLICATIONS

Zaghib et al. "Safe and Fast-Charging Li-Ion Battery with Long Shelf Life for Power Applications" J. Power Sources. vol. 196, No. 8, Apr. 2011, 6 pages.
Office Action dated Aug. 30, 2019 for U.S. Appl. No. 15/892,158; 12 Pages.
Notice of Allowance dated Jan. 28, 2020 for U.S. Appl. No. 15/892,158; 9 Pages.
PCT International Search Report dated Apr. 26, 2019 for International Application No. PCT/US19/15811; 3 Pages.
PCT International Written Opinion dated Apr. 26, 2019 for International Application No. PCT/US19/15811; 8 Pages.
PCT International Search Report dated May 8, 2019 for International Application No. PCT/US19/15814; 3 Pages.
PCT International Written Opinion dated May 8, 2019 for International Application No. PCT/US19/15814; 6 Pages.
Response to Office Action dated Aug. 30, 2019 for U.S. Appl. No. 15/892,158, filed Nov. 22, 2019, 35 pages.
International Preliminary Report on Patentability dated Aug. 20, 2020 for International Application No. PCT/US2019/015814; 8 Pages.
International Preliminary Report on Patentability dated Aug. 20, 2020 for International Application No. PCT/US2019/015811; 10 Pages.

\* cited by examiner

DETUNING FOR A RESONANT WIRELESS POWER TRANSFER SYSTEM INCLUDING COOPERATIVE POWER SHARING

GOVERNMENT RIGHTS

This invention was made with Government support under Contract No. FA8721-05-C-0002 awarded by the U.S. Air Force. The Government has certain rights in the invention.

BACKGROUND

As is known in the art, the rapid growth of Internet of Things (IoT) devices has led to a corresponding growth in the adoption of near-field wireless charging for various applications. However, as the number of wireless power receivers grows, so will the number of wireless charging circuits and devices (collectively "chargers") that might be not strictly standards compliant or not intended or appropriate for use with a particular device (collectively "counterfeit" chargers). Given the critical nature of at least some tasks performed by IoT devices, protecting IoT devices from harsh transient signals (or more simply "transients") imposed by counterfeit wireless chargers is crucial for at least several reasons not including the need to avoid damage to the devices due to such harsh transients. These transients could have potentially destructive impacts on both the receiver's electronics and the battery being charged. This further raises the challenge that underdamped LC resonant tank circuits (or more simply "tanks") used by at least some resonant wireless power transmission (WPT) systems tend to cause overvoltage or overcurrent conditions in response to the transients imposed by counterfeit chargers.

Secure hash algorithm (SHA)-based cryptographic authentication protocols have been implemented commercially for the purpose of avoiding a device using a potentially damaging charger (i.e. a counterfeit wireless charger). These solutions use a receiver-based cryptographic element in the device to be charged that generates a so-called "challenge" (i.e. a request for authentication) using a predetermined key. A charger having an appropriate key can then decrypt and respond to that challenge. The receiver in the device to be charged is open circuited until it receives the correct response, upon which the device to be charged begins drawing energy from the charger.

While a similar challenge-response protocol for charger authentication could be employed for incorporating secure charging into WPT, this protocol is only well-suited to a one-charger, one-receiver scenarios. The projected scale of IoT wireless power receivers in the near future would require multiple receivers with multiple chargers, in such scenarios authentication based upon a pre-shared secret (symmetric key) would be unsustainable and unscalable. Symmetric key authentication between the receiver and the charger requires that the receiver either be pre-programmed with the private keys of all possible chargers or be capable of exchanging a new key upon encountering a new charger. Such an authentication process requires all chargers and receivers share a master key that facilitates the key exchange over the same communication channel, thus introducing a weak point into the system.

Conversely, public key authentication uses two separate keys—a publicly known key used by the receiver for generating the challenge (public key) and its associated private key that is known only to the charger and is used for generating the response. The distribution of the charger public keys can be handled by issuing certificates signed by a trusted certificate authority, in a way similar to the key-exchange handshake implemented in the transport layer security (TLS) protocol.

In a scenario where, multiple receivers are coupled to the same charger, the power delivered to a receiver is a strong function of its proximity and orientation (which is related to the magnetic coupling coefficient) with respect to the charger coil, with more power going to the closer receiver. This physically imposed constraint might not necessarily reflect the actual energy requirements of the various receivers.

SUMMARY

Wireless resonant inductive power receivers for achieving detuning for a resonant wireless power transfer system including cooperative power sharing is described. Cooperative power sharing allows for detuning one or more wireless received coupled to a wireless charger to alter the power received at each wireless receiver.

In accordance with one aspect of the concepts described herein a wireless resonant inductive power receiver for cooperative power sharing between two or more wireless resonant inductive power receivers coupled to a wireless resonant power charger comprises a main inductive element resonating at a frequency. The wireless resonant inductive power receiver may further include an auxiliary inductive element wirelessly coupled to the main inductive element.

The wireless resonant inductive power receiver may further include one or more of the following features either taken individually or in any combination: wherein the resonant frequency is based upon an impedance presented to the second inductive element; wherein the second inductive element is further coupled to a duty cycle control, the duty cycle control configured to adjust the impedance presented to the second inductive element; wherein the duty cycle control is configured to adjust the impedance presented to the second inductive element so that the resonant frequency is equal to a resonant frequency of the wireless charger; wherein the duty cycle control is configured to adjust the impedance presented to the second inductive element so that the resonant frequency is not equal to a resonant frequency of the wireless charger; wherein the second inductive element is further coupled to an auxiliary rectifier, wherein the impedance presented to the second inductive element comprises an input impedance of the auxiliary rectifier; wherein the input impedance of the auxiliary rectifier is based upon a duty cycle of the auxiliary rectifier; wherein the first inductive element is further coupled to a main rectifier and the second inductive element is further coupled to an auxiliary rectifier; wherein an output of the main rectifier and an output of the auxiliary rectifier are configured to supply power to a load; wherein the first inductive element is larger in physical size than the second inductive element; wherein the resonant frequency is based upon a capacitance coupled to the main inductive element; a third inductive element wirelessly coupled to the first inductive element; wherein the wherein the resonant frequency is based upon an impedance presented to the third inductive element; wherein third inductive element is further coupled to a second duty cycle control, the second duty cycle control configured to adjust the impedance presented to the third inductive element; wherein the first inductive element is one of a plurality of main inductive elements; wherein each at least one of the plurality of main inductive elements is coupled to at least one of a plurality of main rectifiers; wherein the second inductive element is one of a plurality of auxiliary inductive elements.

In accordance with a further aspect of the concepts described herein, a wireless resonant inductive power receiver for cooperative power sharing between two or more wireless resonant inductive power receivers coupled to a wireless resonant power charger includes a main inductive coil resonating at a frequency and wirelessly coupled to an auxiliary inductive coil. The wireless resonant inductive power receiver may further include an auxiliary rectifier coupled to the auxiliary inductive coil, wherein the frequency of the main inductive coil is based upon a duty cycle of the auxiliary rectifier; and a detuning engine configured to control the duty cycle of the auxiliary rectifier.

The wireless resonant inductive power receiver may further include one or more of the following features either taken individually or in any combination: wherein the detuning engine is further configured to detect a second wireless resonant inductive power receiver in proximity; wherein the detuning engine is further configured to adjust the duty cycle of the auxiliary rectifier based upon the detected second wireless resonant inductive power receiver; wherein the detuning engine is configured to control the duty cycle so that power from a wireless charger is redistributed between the wireless resonant inductive power receiver and the second wireless resonant inductive power receiver; wherein the detuning engine is configured to adjust the duty cycle so that the resonant frequency of the main coil is adjusted away from a resonant charging frequency of a wireless charger when a second wireless resonant inductive power receiver is in proximity to the wireless resonant inductive power receiver; wherein the detuning engine is further configured to detect a second wireless resonant inductive power receiver in proximity, wherein the detuning engine is further configured to adjust the duty cycle of the auxiliary rectifier based upon the detected second wireless resonant inductive power receiver; wherein the detuning engine is configured to control the duty cycle so that power from a wireless charger is redistributed between the wireless resonant inductive power receiver and the second wireless resonant inductive power receiver; wherein the detuning engine is configured to adjust the duty cycle so that the resonant frequency of the main coil is adjusted away from a resonant charging frequency of a wireless charger when a second wireless resonant inductive power receiver is in proximity to the wireless resonant inductive power receiver.

In accordance with a further aspect of the concepts described herein, a method for detuning a wireless resonant inductive power receiver comprises determining a desired duty cycle; and adjusting a resonant frequency of a main inductive element of a wireless receiver. Wherein adjusting the resonant frequency of the main inductive element comprises adjusting an impedance presented to an auxiliary inductive element of the wireless receiver based upon the determined, desired duty cycle.

The method may further include one or more of the following features either taken individually or in any combination: wherein the main inductive element is wirelessly coupled to the auxiliary inductive element; wherein the auxiliary inductive element is coupled to an auxiliary rectifier; wherein the impedance presented to the auxiliary inductive element comprises an impedance at an input of auxiliary rectifier; wherein adjusting an impedance presented to the auxiliary inductive element comprises adjusting a duty cycle of an auxiliary rectifier based upon the determined, desired duty cycle; wherein adjusting the duty cycle of the auxiliary rectifier comprises selecting a control voltage associated with the determine, desired duty cycle; wherein adjusting the resonant frequency of the main inductive element comprises adjusting the resonant frequency of the main inductive element to be effectively equal to a charging frequency; wherein adjusting the impedance presented to the auxiliary inductive element comprises adjusting the impedance presented to the auxiliary inductive element to be effectively open.

In accordance with a further aspect of the concepts described herein, a wireless resonant inductive power receiver coupled to a wireless resonant power charger, the wireless resonant inductive power receiver comprises a main inductive element resonating at a frequency; and an auxiliary rectifier, wherein the resonant frequency of the main inductive element is based upon an impedance of the auxiliary rectifier.

The wireless resonant inductive power receiver may further include one or more of the following features either taken individually or in any combination: wherein the auxiliary rectifier is further coupled to an auxiliary inductive element; wherein the auxiliary inductive element is wirelessly coupled to the main inductive element; wherein the main inductive element is one of a plurality of main inductive elements; an auxiliary inductive element, wherein the auxiliary inductive element is one of a plurality of auxiliary inductive elements; wherein the main inductive element is coupled to a main rectifier; wherein the main rectifier is coupled to a load, wherein the rectifier is configured to deliver power to the coupled load; wherein the main rectifier is configured to rectify a current from the main inductive element.

BRIEF DESCRIPTION OF THE DRAWINGS

The foregoing features of the disclosure, as well as the disclosure itself may be more fully understood from the following detailed description of the drawings, in which.

DETAILED DESCRIPTION

This application shares subject matter with U.S. patent application Ser. No. 15/892,158 entitled "Detuning for a Resonant Wireless Power Transfer System Including Cryptography," filed concurrently with the present application on Feb. 8, 2018, and here incorporates by reference in its entirety.

Figure 1:
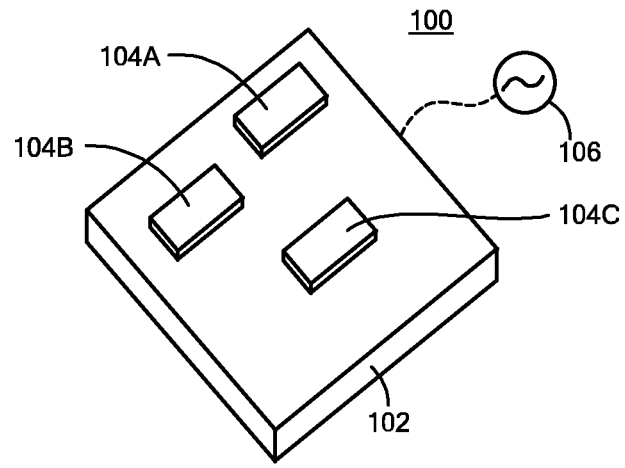
FIG. 1 is an isometric view of a plurality of devices to be wirelessly charged disposed on a structure which functions as a wireless power charger.

Referring now to FIG. 1, a wireless power transfer transmitter 102 (also referred to herein as a "wireless power charger" or more simply as a "wireless charger") has disposed thereon one or more (here three) wireless power transfer receivers (also referred to herein as "wireless receivers" or "devices to be charged") 104A-C. Wireless charger 102 is here shown as a "pad," but other wireless charger structures may, of course, also be used.

As will be explained in detail below, the wireless charger 102 and the devices to be charged 104 are configured to achieve wireless resonant charging. Thus, wireless charger 102 and one or more devices to be charged 104 are said to form a wireless resonant charging system.

It is important to note that the system 100 may include any number of wireless chargers 102 and wireless receivers 104. While in some embodiments the number of wireless receivers 104 is greater than the number of wireless transmitters 102 (such as in the illustrative embodiment of FIG. 1), in other embodiments the number of wireless receivers 104 may be fewer than or equal to the number of transmitters 102.

Wireless charger 102, may comprise, for example, an object with a flat surface (such as a mat), a printed circuit board (PCB), dongle, device case, or any combination thereof—to name a few examples. Wireless charger 102 includes a tank circuit (comprising at least one capacitor, at least one resistor, and at least one inductive element (e.g. an inductive coil), or any or any combination thereof) connected to a power source 106. According to some embodiments, power source 106 may comprise an alternating current ("AC") power source, such as a wall outlet providing, for example, 120V at 60 Hz, 220V at 50 Hz, 230V at 50 Hz, 100V at 50/60 Hz, or any combination thereof, to name a few. In other embodiments, power source 106 may comprise an AC output of one or more power convertors or a series of power convertors such as invertors, half-bridge rectifiers, full-bridge rectifiers, transformers, or any combination thereof—to name a few examples. In some embodiments, the power convertors or series of power convertors may be located within wireless charger 102, while in other embodiments, the power convertors or series of power convertors may be external to wireless charger 102.

Wireless charger 102 is configured to wirelessly deliver power to at least one of wireless receivers 104 through resonant inductive power transfer. While in the illustrative embodiment of FIG. 1, wireless charger 102 is delivering power to three wireless receivers 104, in other embodiment wireless charger 102 may deliver power to more or fewer receivers 102.

Current from power source 106 is provided to the inductive element of wireless charger 102, as current flows through the inductive coil of wireless charger 102, the inductive coil emits or otherwise generates a magnetic field. Further, the inductive element of wireless charger 102 resonates at a frequency. The frequency at which the inductive element of wireless charge 102 resonates is determined by the configuration of the tank circuit of the wireless charger 102, for example the effective inductance, capacitance, and resistance of the tank circuit. As an example, the resonant frequency of the inductive element of wireless charger 102 may be determined by the inductance of the inductive element and the capacitance values of the capacitors within the tank circuit of wireless charger 102.

As the inductive element of wireless charger 102 resonates at a frequency, coupling occurs between the inductive element of charger 102 and one or more other inductive elements within a range of the inductive element of wireless charger 102. These other inductive elements resonate at the same or different frequencies from wireless charger 102. The strength of the coupling between the inductive element of charger 102 and the other inductive elements is determined by the difference between the frequency at which the inductive element of charger 102 resonates and the frequency at which the other inductive element resonates. Coupling between the inductive elements strengthens as the frequencies approach one another in value (i.e. the frequency at which the inductive element of wireless charger 102 resonates becomes closer in value to the frequency at which the other inductive element resonates) and weakens when the frequencies diverge from one another in value (i.e. the frequency at which the inductive element of wireless charger 102 resonates becomes more disparate in value from the frequency at which the other inductive element resonates). The strongest coupling between the inductive element of wireless charger 102 and another inductive element occurs when both resonate at the same frequency—i.e. the other inductive element is "tuned" to the frequency of the inductive element of the wireless charger 102, or vice versa.

Because the inductive element of wireless charger 102 is resonating at a frequency when it establishes a magnetic field, the established magnetic field is spread over the coupling between the inductive element of wireless charger 102 and one or more other inductive elements, rather than spread omni-directionally. The strength (i.e. the magnetic flux density) of the magnetic field spread over the coupling is dependent upon the strength of the coupling, with a stronger coupling providing a stronger magnetic field to a coupled inductive element and a weaker coupling providing a weaker magnetic field to a coupled inductive element.

Wireless receivers 104A-C may each comprise, for example, a device case, a PCB, a dongle, or any combination thereof—to name a few examples. Each wireless receiver 104 includes at least one tank circuit (each comprising at least one capacitor, at least one resistor, and at least one inductive element) and is coupled to a load, or target. The load may comprise, for example, the battery of a mobile device (such as a cellular phone, tablet, smartphone, Bluetooth device, portable speaker, or any combination thereof—to name a few examples), a portable computer, a vehicle, or any combination thereof—to name a few examples.

Each inductive element of wireless receivers 104 is further configured (or "tuned") to resonate at a frequency. The frequency at which the inductive elements of receivers 104 resonate is determined by the configuration of the tank circuit of each respective receiver 104, for example the effective inductance, capacitance, and resistance of the tank circuits. As an example, the resonant frequency of an inductive element of a wireless receiver 104 may be determined by the inductance values of the inductive coils and the capacitance values of the capacitors within a tank circuit of a wireless receiver 104.

As discussed above, when one or more inductive elements enter a range of wireless charger 102, coupling occurs between the inductive elements and the inductive elements of wireless charger 102. The range of wireless charger 102 comprises the distance that wireless charger 102 may spread the established magnetic field over the resonant coupling. For example, wireless charger 102 may spread the established magnetic field up to a distance of effectively three to four inches over resonant coupling. According to some embodiments, the range is of an order greater than a physical size of the charging coil. As a wireless receiver 104 enters a range of wireless charger 102, coupling occurs between the inductive element of wireless charger 102 and the inductive element of wireless receiver 104.

Further, as discussed above, the strength of the coupling between the inductive element of wireless charger 102 and another inductive element is dependent upon the difference in the resonant frequencies of the inductive elements. According to some embodiments, the inductive element of charger 102 may be tuned to resonate at a so-called "charging frequency." Because coupling between the inductive element of wireless charger 102 and another inductive element is strongest when the inductive elements are tuned to the same frequency, the charging frequency comprises the frequency at which the inductive element of charger 102 resonates—in other words, the frequency at which other inductive elements need to be tuned to ensure maximum coupling with the inductive element of wireless charger 102.

According to some embodiments, the strength of the coupling between the inductive element of wireless charger 102 and the inductive element of wireless receiver 104 depends on the difference between the resonant frequency of the inductive element of wireless receiver 104 and the charging frequency, i.e. stronger coupling occurs as the resonant frequency of the inductive element of wireless receiver 104 approaches the charging frequency. The strength of the coupling between the inductive element of wireless charger 102 and the inductive element of wireless receiver 104 further depends on the orientation and location of wireless receiver 104 with respect to wireless charger 102. For example, the strength of the coupling between wireless charger 102 and a wireless receiver 104 may be dependent upon the distance between wireless charger 102 and wireless receiver 104 and also the angle of wireless receiver 104 with respect to wireless charger 102 (and more particularly, the angle of the inductive element in the wireless receiver relative to the inductive element in the wireless charger). According to some embodiments, the angle is measured as the angle made by a plane of the inductive element wireless receiver 104 with respect to a plane of the inductive element of wireless charger 102.

Once coupling occurs between the inductive element of wireless charger 102 and the inductive element of wireless receiver 104, the magnetic field established by charger 102 excites an AC current within the inductive element of the wireless receiver 104. In other words, the inductive element of the wireless receiver 104 acts as an AC energy source upon coupling to wireless charger 102. The amount of current provided by the inductive element of wireless receiver 104 is determined by the strength (i.e. magnetic flux density) of the magnetic field spread to the inductive element of wireless receiver 104. In some embodiments, the AC current provided to the load coupled to the wireless receiver 104 to, for example, charge the load.

According to some embodiments, each wireless receiver 104A-C may further comprise power convertors to convert the AC current generated by its inductive element into DC power before it is delivered to the load to, for example, charge a load that requires a DC power source to charge. As some examples, each wireless receiver 104A-C may comprise a half-bridge rectifier, a whole-bridge rectifier, voltage regulators, linear regulators, or any combination thereof—to name a few examples.

According to some embodiments, wireless charger 102 may couple to (and thus deliver power to) wireless receivers 104 while wireless receivers 104 are in contact in wireless charger 102 (such as in the illustrative embodiment of FIG. 1), in other embodiments, wireless charger 102 may couple to wireless receivers 104 not in contact with wireless charger 102. For example, in some embodiments, wireless charger 102 may deliver power to wireless receivers 104 up to 4 meters away from wireless charger 102.

Figure 2:
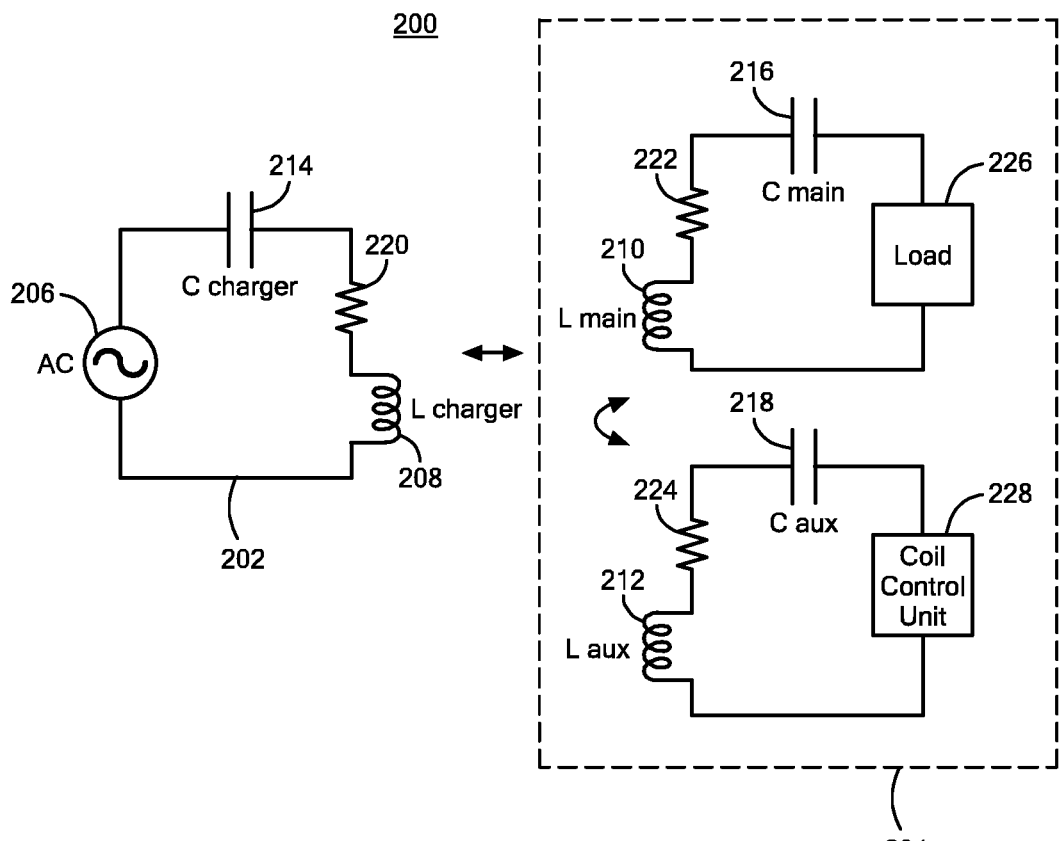
FIG. 2 is a block diagram of a wireless power charger and a wireless power receiver which form a wireless resonant charging system.

Referring now to FIG. 2, a wireless charging system 200 includes a wireless charger 202 comprising a tank circuit and wireless power receiver 204 comprising a main tank circuit and an auxiliary tank circuit both coupled to a load 226. As discussed above, the wireless charger tank circuit comprises a capacitor $C_{charger}$ 214, resistor 220 and an inductive coil $L_{charger}$ 208 coupled to a voltage source 206, where $L_{charger}$ 208 resonates at a frequency according to the tank circuit, specifically according to the capacitance of $C_{charger}$ 214.

Wireless receiver 204 comprises a main tank circuit, comprising a capacitor $C_{main}$ 216, resistor 222, and a main inductive element 210 here shown as a coil $L_{main}$ coupled to a load 226 and an auxiliary tank circuit comprising capacitor $C_{auxiliary}$ 218, resistor 224, and auxiliary inductive element 212, here shown as a coil $L_{auxiliary}$ coupled to a control circuit 228 which corresponds to a coil control circuit when the inductive elements are provided as coils. The control circuit is configured to control the impedance coupled to auxiliary tank circuit as discussed in detail below with reference to FIG. 3.

The inductive element $L_{main}$ is configured to resonate, or be tuned, to a desired frequency (also referred to herein as a "main frequency"). Because the resonant frequency of $L_{main}$ is determined by the main tank circuit, to achieve this desired frequency, the value of inductive element $L_{main}$ is selected in conjunction with the main tank circuit, specifically according to the capacitance value of a capacitive element $C_{main}$. The inductive element $L_{auxiliary}$ is configured to resonant, or be tuned, to a second desired frequency (also referred to herein as an "auxiliary frequency"). Because the resonant frequency of $L_{auxiliary}$ is determined by the auxiliary tank circuit, to achieve this second desired frequency, the value of inductive element $L_{auxiliary}$ is selected in conjunction with the auxiliary tank circuit, specifically the capacitance of capacitive element $C_{auxiliary}$. In other words, inductive element $L_{main}$ is tuned according to the main tank circuit while inductive element $L_{auxiliary}$ is tuned according to the auxiliary tank circuit.

As discussed above, when a wireless receiver is within range of a wireless charger, the inductive element of a wireless receiver couples to the inductive element of the wireless charger so that power may transfer wirelessly between the two components (i.e. the charger and the receiver) via a spread magnetic field. Similarly, when the wireless receiver is within range of the wireless charger, inductive elements $L_{main}$ and $L_{auxiliary}$ couple with $L_{charger}$ so that wireless power transfer may occur between the wireless charger and the wireless receiver via the magnetic field spread to $L_{main}$ and $L_{auxiliary}$.

As discussed above, the strength of coupling between inductive elements (such as $L_{main}$ and $L_{charger}$ and $L_{auxiliary}$ and $L_{charger}$) is controlled, in part, by the difference in resonant frequency, or tuning, between the inductive elements, for example the difference between the resonant frequency $L_{charger}$ and $L_{main}$ or the difference between $L_{charger}$ and $L_{auxiliary}$. The strength of the coupling between inductive elements may further be controlled by the physical size of each respective inductive element, the number of turns in each respective inductive element, the proximity of the inductive elements relative to each other, the impedance coupled to each inductive element, the orientation of each inductive element relative to each other, or any combination thereof—to name a few examples.

Further, $L_{main}$ and $L_{auxiliary}$ are coupled due to the resonant nature of both inductive elements. The strength of the coupling between the inductive elements $L_{main}$ and $L_{auxiliary}$ is controlled, in part, by the resonant frequency of each inductive element, the physical size of each inductive element, their proximity with respect to each other, their orientation with respect to each other, or any combination thereof—to name a few examples. In the illustrative embodiment of FIG. 2, due to the close proximity of inductive elements $L_{main}$ and $L_{auxiliary}$, the coupling between $L_{main}$ and $L_{auxiliary}$ results in a "strong coupling" and while the coupling between $L_{charger}$ and $L_{main}$/$L_{auxiliary}$ results in a "weak coupling." That is to say, the strength of the coupling between $L_{main}$ and $L_{auxiliary}$ is much greater than that of $L_{charger}$ and $L_{main}$/$L_{auxiliary}$. For example, in the illustrative embodiment of FIG. 2, the strength of the coupling between $L_{main}$ and $L_{auxiliary}$ is approximately four or more times greater than that of $L_{charger}$ and $L_{main}$/$L_{auxiliary}$.

In some embodiments, the strength of the coupling between a wireless charger and wireless receiver (e.g. the coupling between inductive elements $L_{charger}$ and $L_{main}$) may further be controlled by the strength of the coupling between elements $L_{main}$ and $L_{auxiliary}$. Specifically, the resonant frequency of $L_{main}$ is adjusted according to the strength of the coupling between $L_{main}$ and $L_{auxiliary}$. The coupling between $L_{main}$ and $L_{auxiliary}$ is dependent upon an impedance shown to the auxiliary tank circuit, as discussed in further detail below with reference to FIG. 3.

The control circuit (e.g. coil control circuit) of the wireless receiver controls the impedance presented to the auxiliary tank circuit. As the impedance presented to the auxiliary tank circuit changes, so does the strength of the coupling between $L_{main}$ and $L_{auxiliary}$ and thus the resonant frequency of $L_{main}$. Therefore, adjusting the impedance connected to the auxiliary tank circuit may alter the resonant frequency of $L_{main}$ to increase the difference between $L_{main}$ and $L_{charger}$, thus altering the strength of the coupling between $L_{main}$ and $L_{charger}$—in other words, detuning $L_{main}$ from $L_{charger}$. This is discussed in further detail below with reference to FIG. 3.

Coupling between two inductive coils may be represented by the following equation:

$$L(s) = \frac{-s^2 M^2}{z_1(s) z_2(s)} \quad \text{[EQ1]}$$

And further $$z_1(s) = sL_1 + R_1 + \frac{1}{sC_1} \quad \text{[EQ2]}$$

$$z_2(s) = sL_2 + R_2 + \frac{1}{sC_2} + R_L \quad \text{[EQ3]}$$

Wherein $L(s)$ represents the feedback loop transfer (i.e. power transfer) between the wireless coils, $z_1(s)$ represents the impedance seen by the first inductive coil, $z_2(s)$ represents the impedance seen by the second inductive coil, and M represents the mutual inductance between the two coils.

A coupling coefficient k between the two inductive coils is defined as:

$$k = m/\sqrt{L_1 L_2} \quad \text{[EQ4]}$$

The loop transfer function gain can be directly modulated by k.

As the coupling coefficient increases, the closed-loop system poles first move towards each other along a circle centered at the origin (with the same resonant frequency). Upon increasing k further, they split, leading to the formation of two separate natural modes in the system, which move further and further apart. If instead, the two LC tanks are tuned at separate frequencies, both the closed loop poles and their associated resonant frequencies immediately begin to move apart as k is increased.

Open-circuiting the load connected to a wireless receiver serves to block power from the charger makes the wireless receiver invisible to the charger, because the back electromotive force (EMF) generated at the charger ($L_1$), $sMI_2$, is zero. Short circuiting the load connected to the wireless receiver ensures a large back EMF and safe operation, but wireless receiver is no longer invisible to the wireless charger. Detuning the wireless receiver by a small fraction from the wireless charger drastically reduces the current through the wireless receiver coil, and thus the power delivered by the wireless receiver to the load. The large forward EMF generated as a consequence is dropped across the residual resistance of the tank circuit. At typical near-field operating frequencies, both the wireless receiver coil and its series capacitor are off-chip and can easily tolerate a large inducted voltage.

Figure 2A:
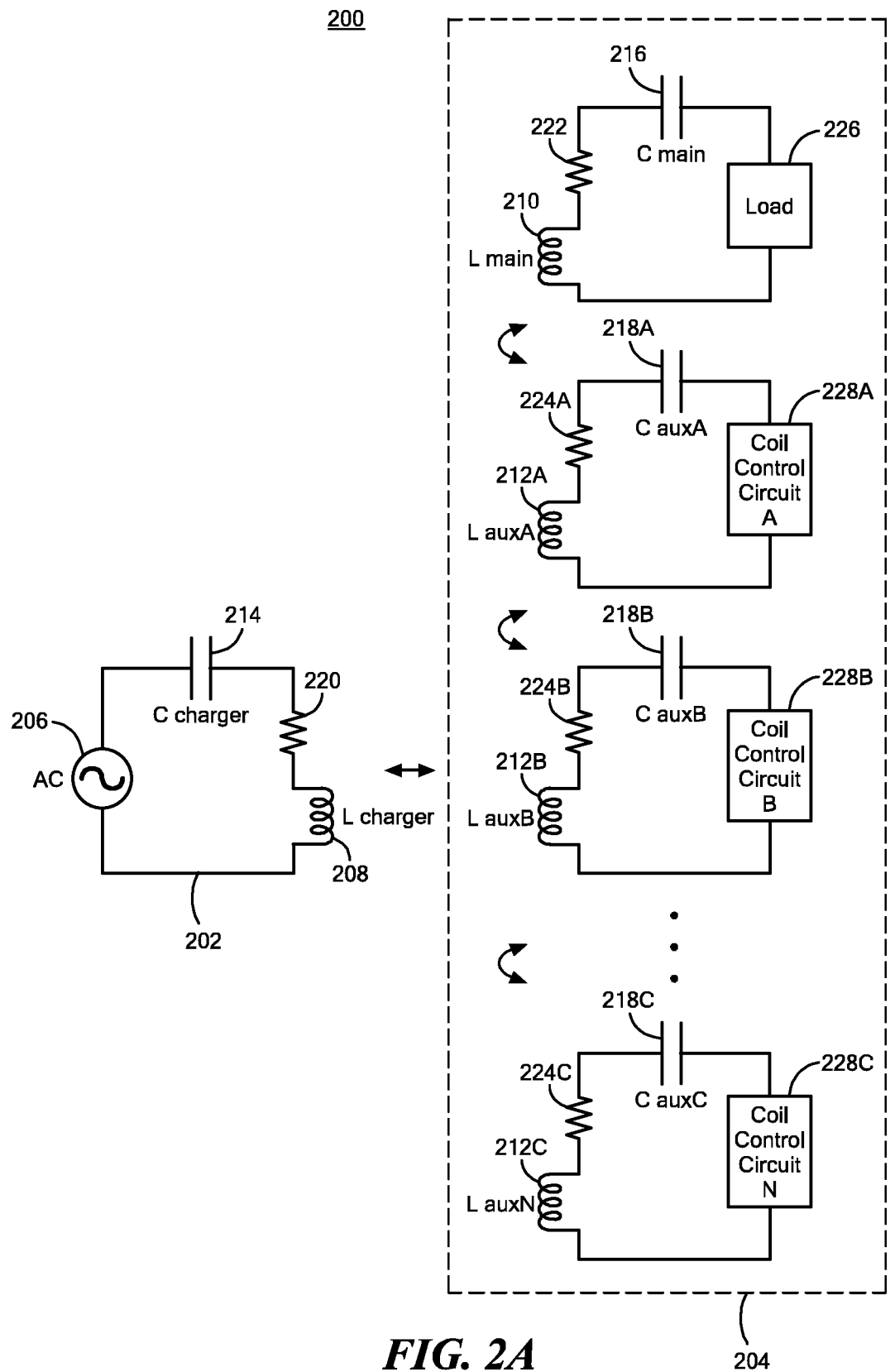
FIG. 2A is a block diagram of an illustrative embodiment of a wireless power charger and a wireless power receiver having a plurality of auxiliary elements.

Referring now to FIG. 2A, a wireless charging system 200 includes a wireless power charger 202 and a wireless power receiver 204. In some embodiments, wireless receiver 202 may comprise more than one auxiliary tank circuit. While in the illustrative embodiment of FIG. 2A, wireless receiver includes three auxiliary tank circuits, in other embodiments a different number of auxiliary tank circuits may be used, such as, for example, from 1 to N auxiliary tank circuits. Each auxiliary tank circuit is coupled to a respective control circuit 228 that is configured to control the effective impedance coupled to the auxiliary tank circuit.

Each auxiliary inductive element 212A-N of an auxiliary tank circuit, represented in the illustrative embodiment of FIG. 2A as coils $L_{auxiliary}$ A-N 212A-N, resonates at a respective desired frequency. Because each auxiliary inductive element 212 resonates at a frequency according to its respective auxiliary tank circuit, to achieve a desired frequency for an auxiliary inductive element, the value of the auxiliary inductive element is selected in conjunction with its respective auxiliary tank circuit, specifically according to the capacitance value of its respective capacitive element $C_{auxiliary}$ 218. For example, the value for auxiliary inductive element $L_{auxiliary}$ B 212B is selected in conjunction with capacitance $C_{auxiliary}$ B 218B to achieve a desired resonant frequency for $L_{auxiliary}$ B.

Further, due to the resonant nature of $L_{main}$ and $L_{auxiliary}$ A-N, coupling exists between $L_{main}$ 210 and each auxiliary inductive element $L_{auxiliary}$ A-N. As discussed above, with reference to FIG. 2, the strength of the coupling between the $L_{main}$ and $L_{auxiliary}$ is dependent on, in part, by the resonant frequency of each inductive element, the physical size of each inductive element, their proximity with respect to each other, their orientation with respect to each other, or any combination thereof—to name a few examples. Likewise, the strength of the coupling between $L_{main}$ and each auxiliary inductive element $L_{auxiliary}$ A-N is dependent on the physical size of each inductive element, their proximity with respect to each other, their orientation with respect to each other, or any combination thereof—to name a few examples.

Further, as discussed above with reference to FIG. 2, the resonant frequency of $L_{main}$ is adjusted according to the strength of the coupling between $L_{main}$ and $L_{auxiliary}$ with the strength of the coupling between $L_{main}$ and $L_{auxiliary}$ being dependent upon an impedance presented to the auxiliary tank circuit. Likewise, the resonant frequency of $L_{main}$ is adjusted according to the strength of the coupling between $L_{main}$ and each auxiliary inductive element $L_{auxiliary}$ A-N. The strength of each coupling between $L_{main}$ and each auxiliary inductive element $L_{auxiliary}$ is dependent on a respective impedance shown to each respective auxiliary tank circuit.

Each control circuit (e.g. coil control circuit) of the wireless receiver controls the impedance presented to the respective auxiliary tank circuit to which it is coupled. As the impedance presented to a respective auxiliary tank circuit changes, so does the strength of the coupling between $L_{main}$ and the respective $L_{auxiliary}$ and thus the resonant frequency of $L_{main}$. Therefore, adjusting the impedance presented to one of the auxiliary tank circuits may alter the resonant frequency of $L_{main}$ to increase the difference between $L_{main}$ and $L_{charger}$, thus altering the strength of the coupling between $L_{main}$ and $L_{charger}$ in other words, detuning $L_{main}$ from $L_{charger}$. This is discussed in further detail below with reference to FIG. 3.

Figure 2B:
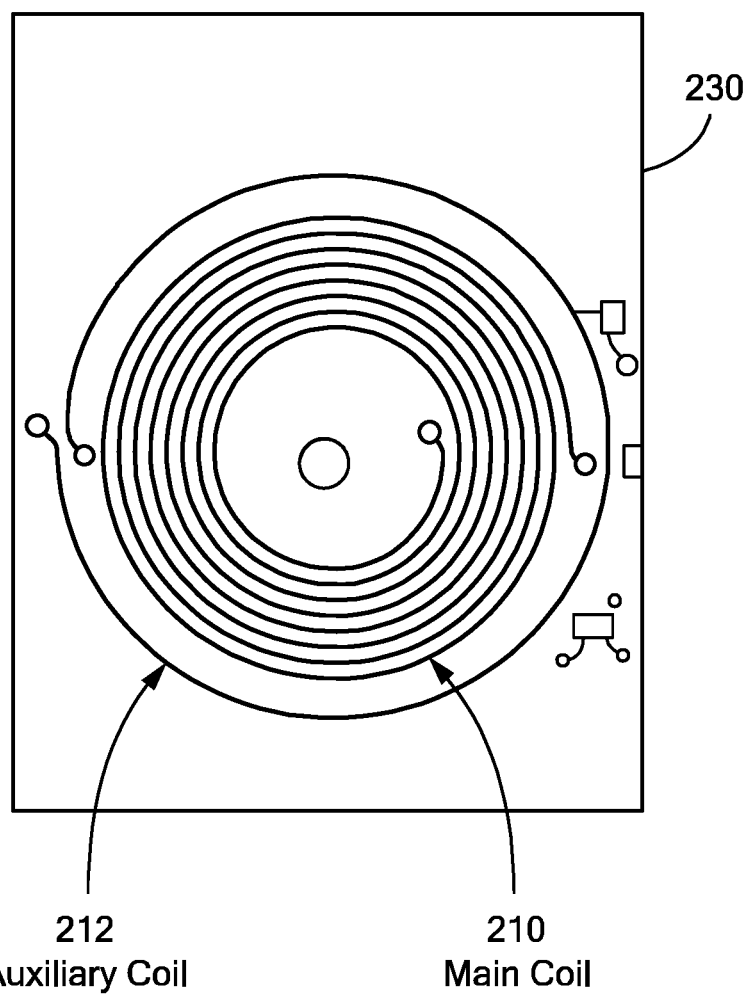
FIG. 2B is an image of a wireless power receiver which may be the same as or similar to the wireless power receiver of FIG. 2A.

FIG. 2B is an image of an exemplary embodiment of a layout for a wireless charging receiver. According to some embodiments, both the main tank circuit and auxiliary tank circuit of wireless receiver may be provided on the same printed circuit board ("PCB") 230. When provided on the same PCB, inductive elements $L_{main}$ 210 and $L_{auxiliary}$ 212 may be arranged so that element $L_{auxiliary}$ 212 surrounds $L_{main}$ 210.

Figure 3:
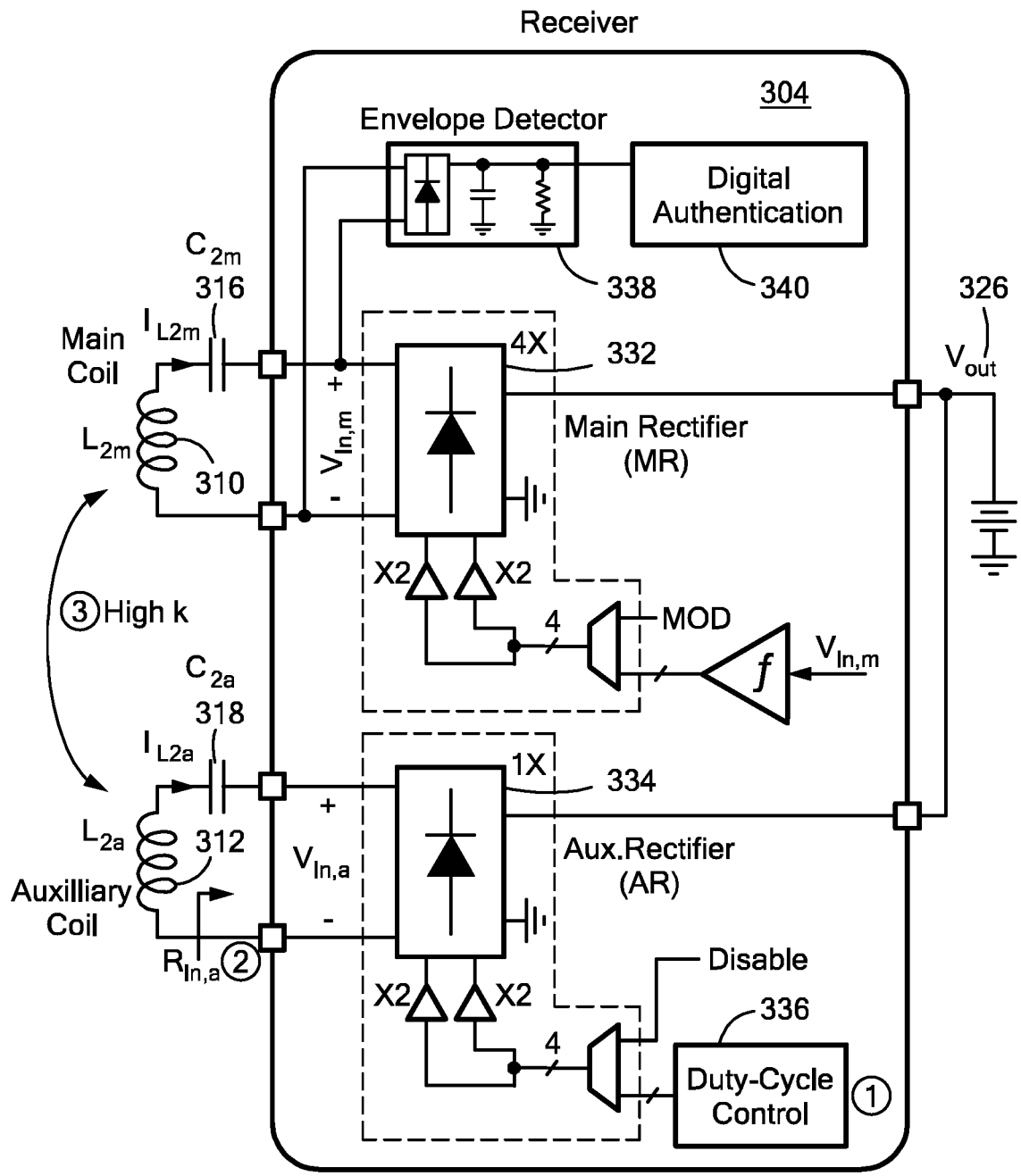
FIG. 3 is a block diagram of a wireless receiver having tank circuits and a control circuit.

Referring now to FIG. 3, a wireless receiver 304 includes tank circuits and control circuits. In the illustrative embodiment of FIG. 3, the wireless receiver comprises a main tank circuit (comprising main coil $L_{2m}$ 310 and capacitor $C_{2m}$ 316) connected or otherwise coupled to a control circuit (comprising envelope detector 338, main rectifier MR 332), and an auxiliary tank circuit (comprising auxiliary coil $L_{2a}$ 312 and capacitor $C_{2a}$ 318) coupled to a control circuit (comprising auxiliary rectifier AR 334 and duty cycle control 336). The output 326 of both MR 332 and AR 334 is connected to a load.

As discussed above, the movement of the poles of two second-order systems under strong coupling can be used to implement detuning. If the two coils on the receiver are coupled, the amount of receiver detuning can be controlled by controlling the value of the feedback transfer function between them.

The wireless receiver in the illustrative embodiment of FIG. 3 has two coils: a main coil 310 that receives the bulk of the power when the receiver is tuned to the charger, and an auxiliary coil 312 that detunes the system when required. The value of the feedback transfer function can be changed by manipulating the value of an impedance connected to the auxiliary coil via the coil control circuit, albeit without direct proportionality to the loop transfer function. A zero-coupling condition can be replicated by open-circuiting the auxiliary coil, which allows the main coil to receive power from a charger tuned to the $L_{2m}$-$C_{2m}$ resonant frequency. Maximizing the magnitude of the feedback transfer function by short-circuiting the auxiliary coil leads to maximal detuning.

Setting the LC resonances of the two coils at separate frequencies leads to better detuning response. The $L_{2a}$-$C_{2a}$ tank is chosen to have a lower resonant frequency than the $L_{2m}$-$C_{2m}$ tank. This has many advantages—because the charger is tuned to the $L_{2m}$-$C_{2m}$ tank when the receiver is receiving power, any harmonics generated by the power amplifier at the charger should not excite the $L_{2a}$-$C_{2a}$ tank at its resonant frequency and lead to a loss in the power transfer efficiency. The higher frequency poles move farther from the original positions than the lower frequency ones, and hence should correspond to the poles of the $L_{2m}$-$C_{2m}$ tank, which receives power in the tuned state. Finally, choosing the $L_{2a}$-$C_{2a}$ tank resonance at a higher frequency could cause issues with it being too close to the self-resonance frequency of the auxiliary coil, beyond which the auxiliary coil behaves as a capacitor.

The resonant frequency of the receiver changes in the region where the impedance connected to the auxiliary coil is comparable to the reactance of the auxiliary coil inductance. As the impedance connected to the auxiliary load increases, the resonant frequency decreases. Under the limit where the impedance connected to the auxiliary coil approaches infinity, the effect of the auxiliary coil begins to disappear and the receiver's resonant frequency approaches:

$$(2\pi\sqrt{L_{2m}C_{2m}})^{-1} \qquad [EQ5]$$

which is the natural oscillation frequency of the main coil tank.

The rectifier connected to the main coil rectifies the AC induced voltage and delivers energy to an external voltage source, which may be, as an example, a battery coupled in parallel with a filter capacitor with low equivalent series resistance ("ESR"). The control circuit comprises an auxiliary rectifier connected to the auxiliary coil and acts as an impedance presented to the auxiliary coil. The auxiliary rectifier has the same external DC voltage source at its output.

In embodiments, the rectifier is a synchronously driven full-bridge rectifier provided from of low-side NMOS and high-side PMOS devices. The gate drivers driving the MOS switches have an in-built, statically configured dead time to prevent a short circuit path forming from the output to ground.

The main coil resonance frequency may be represented as:

$$(2\pi\sqrt{L_{2m}C_{2m}})^{-1} \qquad [EQ6]$$

Also known as the frequency at which the charger transmits power, may be set to, in an example embodiment, 6.78 MHz ($f_{op}$). The auxiliary coil resonance frequency is represented as:

$$(2\pi\sqrt{L_{2a}C_{2a}})^{-1} \qquad [EQ7]$$

The auxiliary coil resonance frequency may be set at, as an example, $f_{op}/2$. When the receiver is configured to accept power, the main rectifier delivers energy to the DC output. In this mode, the impedance coupled to auxiliary rectifier is made large by disabling its switch gate drive. The main rectifier is controlled by a synchronous gate driver that uses comparators to detect the turning on of the body diodes in order to turn the FETs on.

An envelope detector made up of a passive, diode-based rectifier followed by an RC low-pass filter demodulates the forward telemetry messages, which appear as an On-Off Keying (OOK) modulated current waveform induced by the charger. For backward telemetry, the receiver uses load-shift keying on the main coil, i.e. shorting the main coil or connecting it to the load in order to signal bits. The short circuit functionality is implemented by using the two low-side switches on the main rectifier instead of adding a separate switch in parallel to the rectifier. This reduces the parasitic capacitance across AC input of the main rectifier by up to 30%.

Figure 4:
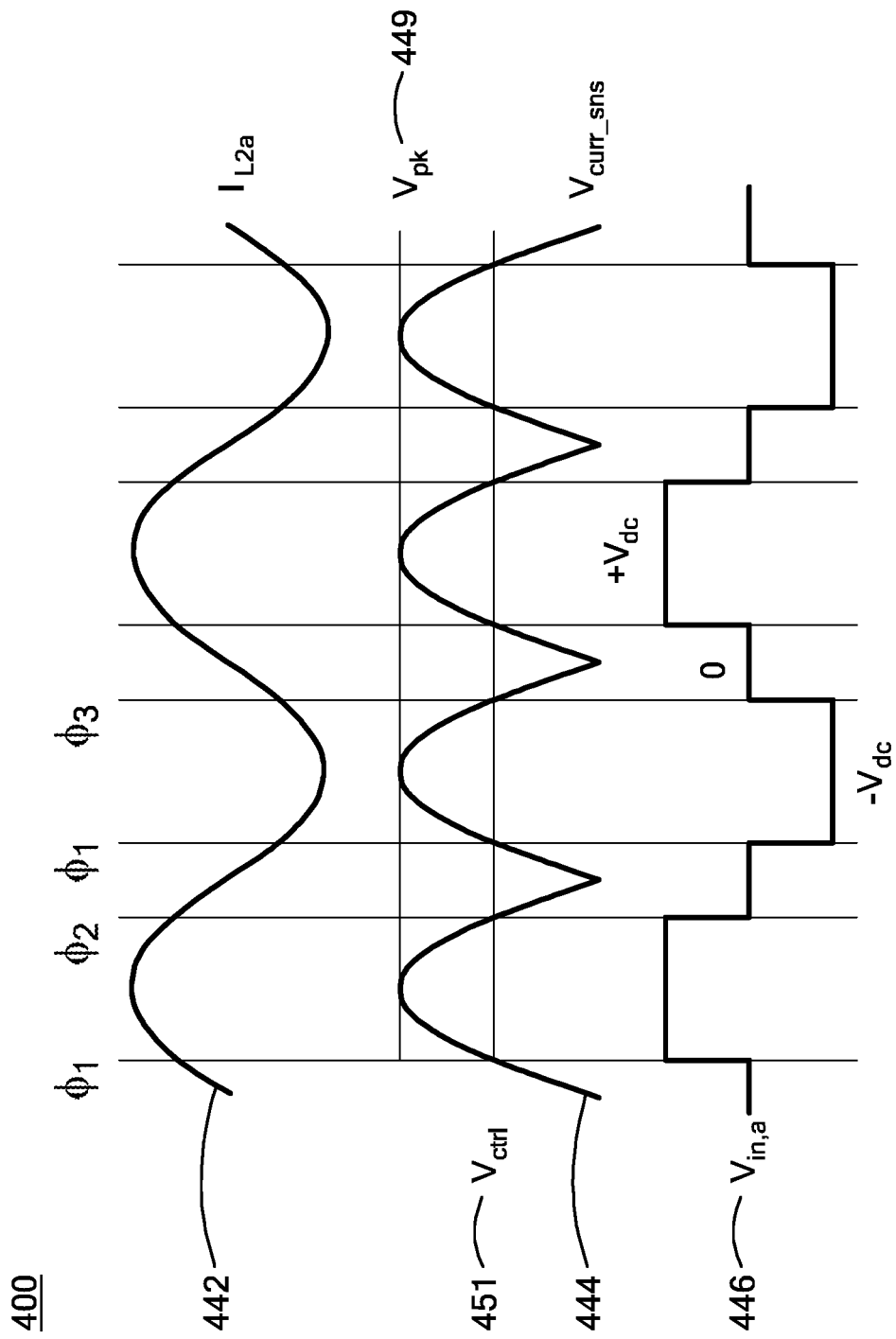
FIG. 4 is a plot of voltage and current vs. time representing a current sense-based rectifier control.

Coil control circuit further includes duty cycle control. Duty cycle control is configured to set a duty cycle to control the AC input resistance of the auxiliary rectifier. The AC input resistance acts as the impedance connected to the auxiliary coil, and thus controls detuning of $L_{main}$. The set duty cycle is determined using a current sense-based approach as depicted in FIG. 4. The voltage $V_{curr\_sns}$ in is obtained by sensing the currents in the active low-side switch using a smaller replica biased transistor whose current is passed through an on-chip resistor.

FIG. 4 is a plot 400 illustrating current sense-based rectifier control. A peak detector circuit retrieves the local peak voltage of $V_{curr\_sns}$ 444, which is shown as $V_{pk}$ 449 in FIG. 4. The duty cycle of the rectifier is set by a DC control voltage $V_{ctrl}$ 451 which is obtained from the peak voltage $V_{pk}$ 449 using a digital-to-analog converter (DAC)-based resistor divider. When current sensor voltage $V_{curr\_sns}$ 444 is less than the DC control voltage $V_{ctrl}$ 451 (i.e. $V_{curr\_sns} < V_{ctrl}$), the auxiliary coil is shorted by turning both the low-side switches on and both the high-side switches off. When current sensor voltage $V_{curr\_sns}$ 444 is greater than the DC control voltage $V_{ctrl}$ (i.e. $V_{curr\_sns} > V_{ctrl}$), the appropriate low- and high-side switches are turned on based on the sign of a current $I_{L2a}$ 442 to deliver power to the output. By changing the settings of the resistor DAC, the value of the DC control voltage $V_{ctrl}$ relative to the local peak voltage of $V_{curr\_sns}$ 444 designated as $V_{pk}$ 449 can be changed. This controls the fraction of the cycle for which the rectifier delivers power to the load. The switch configurations for two of the three phases of the rectifier in FIG. 4 are shown in FIGS. 5 and 5A.

Figure 5:
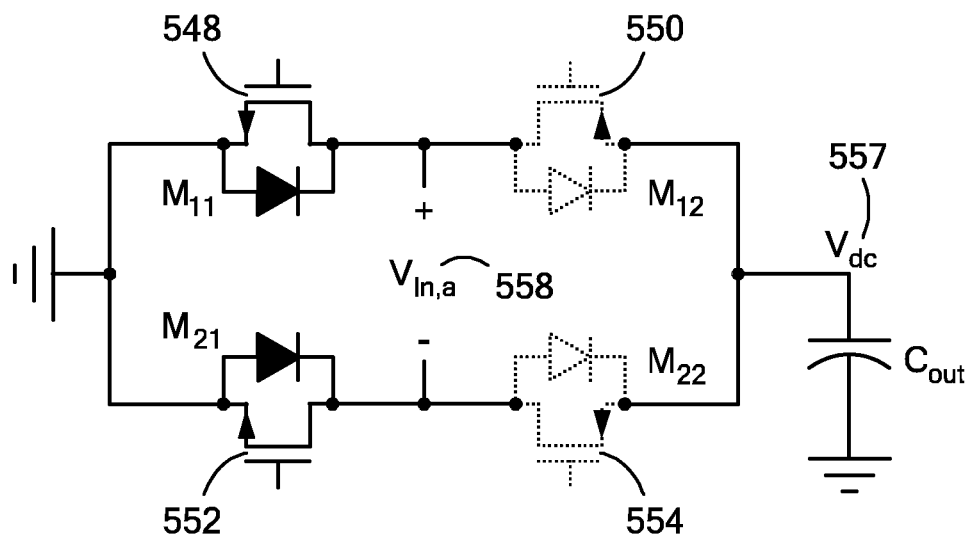
FIGS. 5 and 5A are schematic circuit diagrams of rectifiers of a wireless receiver.
Figure 5A:
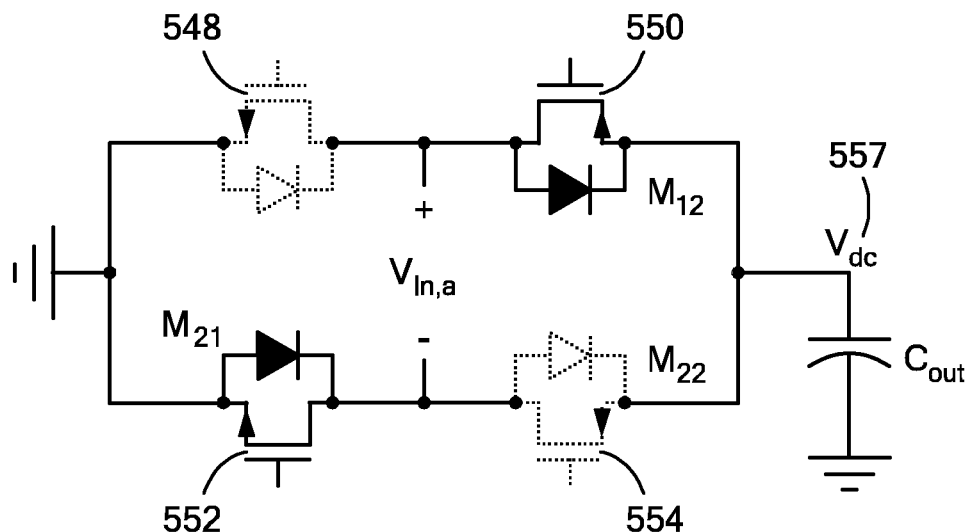

FIGS. 5 and 5A illustrate a circuit diagram of the rectifiers 500 of the wireless receiver. The reflections may, for example, comprise a plurality of MOSFETs 548-554. The output 557 of the auxiliary rectifier can be considered as a DC voltage. Hence, across its AC input terminals, the auxiliary rectifier can be modeled with an AC voltage source in phase with its input current and a series resistor that models the on resistance of its switches. Even though the rectifier cannot be modeled solely as a load resistor of fixed value, the two-coil receiver system still has two complex conjugate open loop pole pairs. The duty cycle of the auxiliary rectifier, δ, can be defined as the fraction of the total oscillation period during which the auxiliary rectifier is connected to its output. The control voltage is related to the duty cycle as $V_{ctrl} = V_{pk} \cos(\pi\delta/2)$. The first harmonic of the input voltage of the auxiliary rectifier, $V_{in,a}$ 446 is proportional to $\sin(\pi\delta/2)$. Modulating $V_{in,a}$ 446 (and hence the effective input resistance of the rectifier) controls the auxiliary coil current ($I_{L2a}$) relative to the main coil current $IL2m$, causing the system poles to move away from $f_{op}$.

Figure 6:
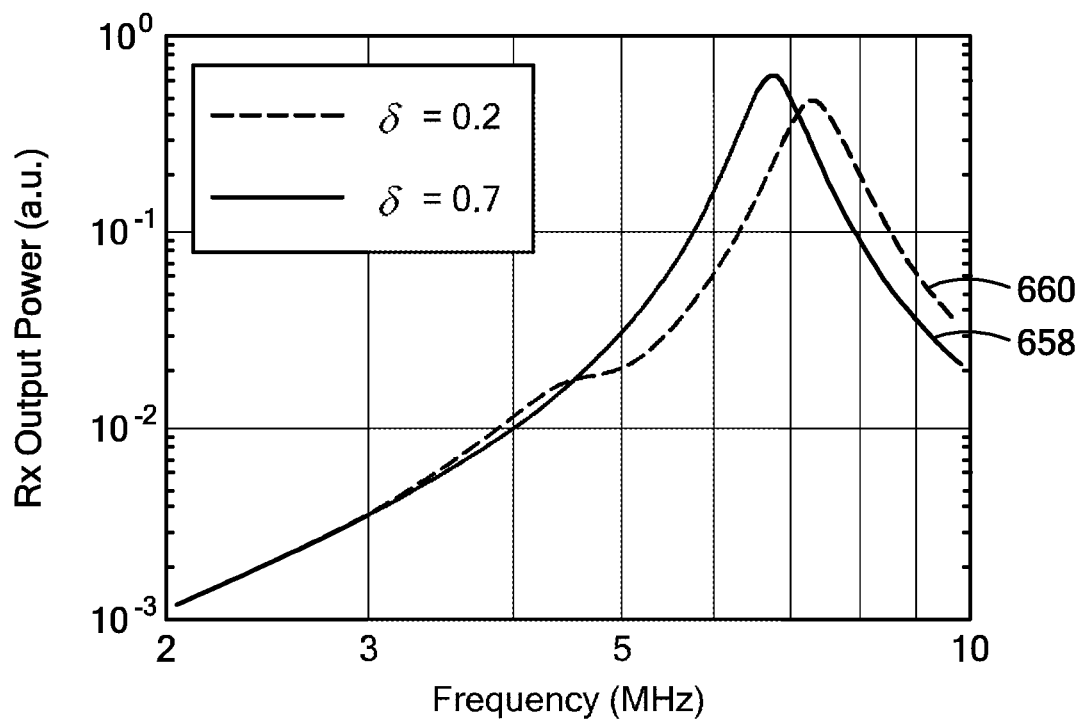
FIG. 6 is a plot of receiver output power vs. frequency, representing the extent of detuning achieved by the use of one or more auxiliary elements within a receiver of a resonant wireless charging system.
Figure 6A:
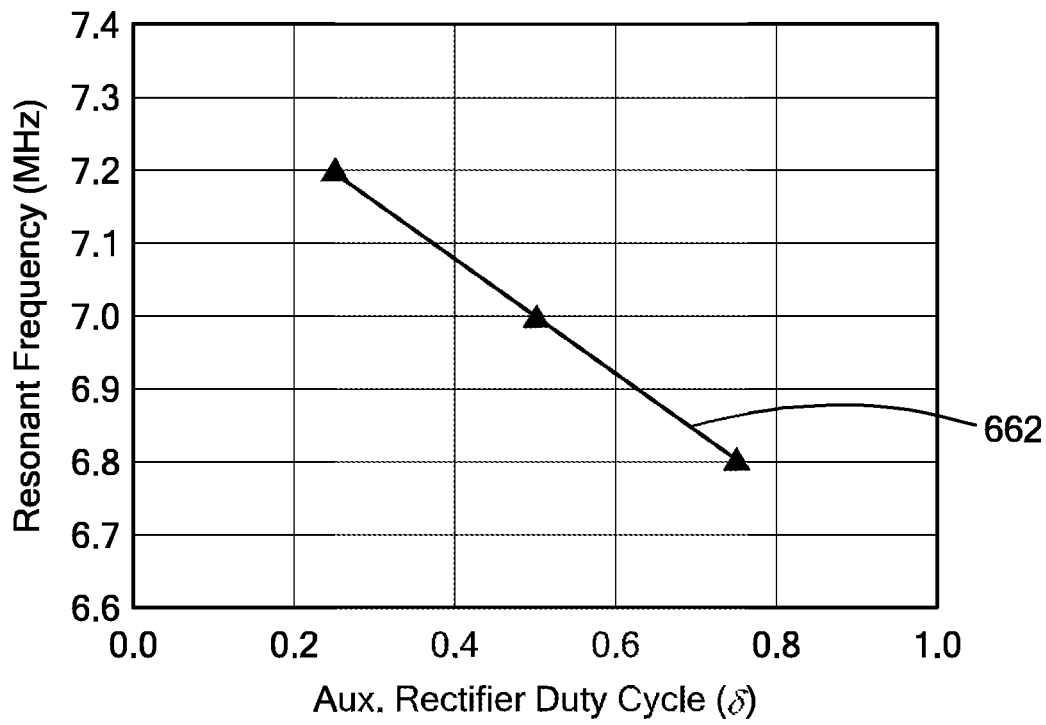
FIG. 6A is a plot of the resonant frequency of the wireless receiver vs the duty cycle of the auxiliary rectifier.

FIG. 6 is a plot, representing the extent of detuning $L_{main}$ within the wireless system at two duty cycles 658 and 660, and FIG. 6A is a plot 662 of the resonant frequency of the wireless receiver vs the duty cycle of the auxiliary rectifier. As the duty cycle, and hence the input resistance, of the auxiliary rectifier is reduced, the receiver begins to detune. This causes both $I_{L2m}$ and the induced back-EMF on the charging coil to decrease. Lowering the input resistance of the auxiliary rectifier, (i.e. the impedance presented to the auxiliary inductive element) leading to a higher resonant frequency at the receiver.

Appropriate sizing of the auxiliary coil is necessary to ensure good detuning performance as well as high efficiency and output power in tuned operation. If the auxiliary coil inductance $L_{2a}$ is made large by having a large area or a large number of turns on it, the mutual inductance from the charging coil to the auxiliary coil increases, and so does the induced voltage from the charger. In this case, when the receiver is configured to receive power from the charger, the large induced voltage on the auxiliary coil can inadvertently turn on the passive rectifier formed by its body diodes even when the gate drive is turned off. This could lead to detuning when it is not desired and lower the overall received power and power transfer efficiency. On the other hand, making L2a small reduces the feedback loop gain and the amount of detuning achievable when the receiver is configured to block the charger.

Figure 7:
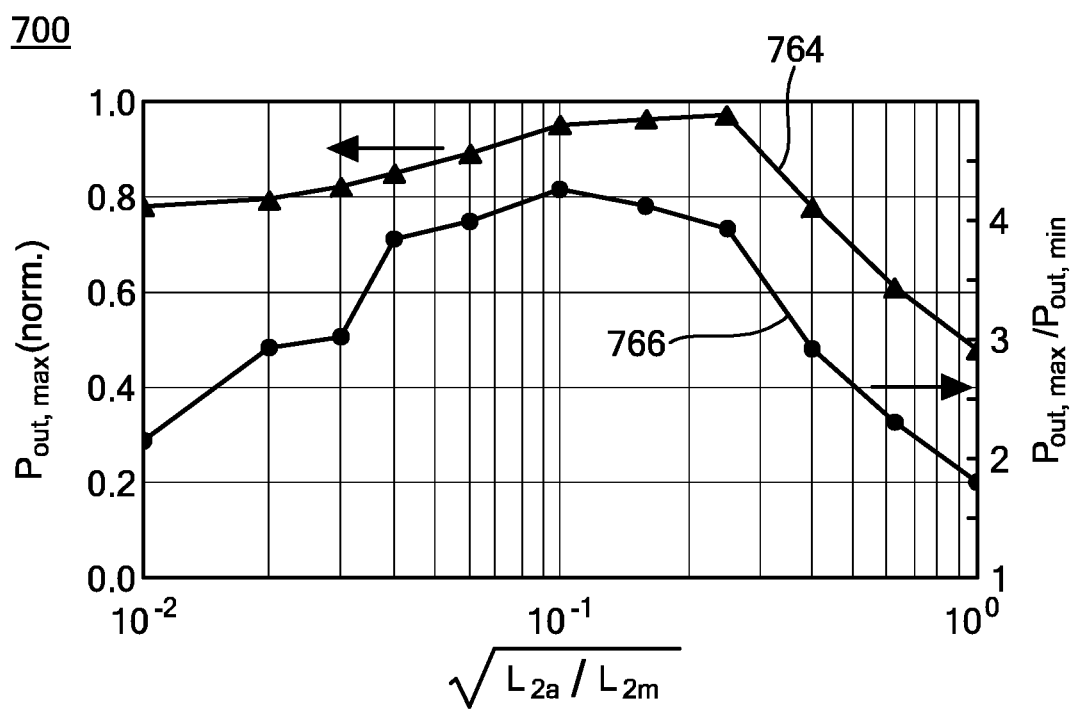
FIG. 7 is a plot of receiver output vs the ratio of the inductive values of the main inductive element to the auxiliary inductive element.

FIG. 7 is a plot 700 of receiver output vs the inductive turns ratio between the main inductive element to the auxiliary inductive element. If the effective turns ratio between the main coil and the auxiliary coil on the receiver, $N_{rx} = \sqrt{(L_{2a}/L_{2m})}$ is large, the maximum output power 764 and 766 goes down since the receiver is fairly detuned even with the auxiliary rectifier gate drive disabled. When the turns ratio is small, the power blocking capability goes down when the auxiliary rectifier is enabled. The power blocking capability is measured as the ratio of the output power when the auxiliary rectifier is fully disabled to the output power when the auxiliary rectifier is fully shorted. A turns ratio may comprise, for example, $N_{rx} = 0.28$ to achieve reasonable detuning while preventing inadvertent detuning during resonant power transfer. Since the auxiliary coil is smaller than the main coil, it has a smaller induced voltage from the charger coil. The currents in the auxiliary coil are also smaller since it is tuned at $f_{op}/2$. Hence, the switches on the main and the auxiliary rectifiers can be scaled, as an example, in a 4:1 size ratio to reflect this.

In some embodiments, the coils are implemented in a concentric fashion for better coupling. The addition of the auxiliary coil leads to a larger total coil area on the receiver, which corresponds to a larger area penalty over having just a main coil. The auxiliary coil also requires an additional ceramic capacitor on the PCB, whose footprint is negligible to the total coil area. In other embodiments, non-concentric configurations may be used.

Figure 8:
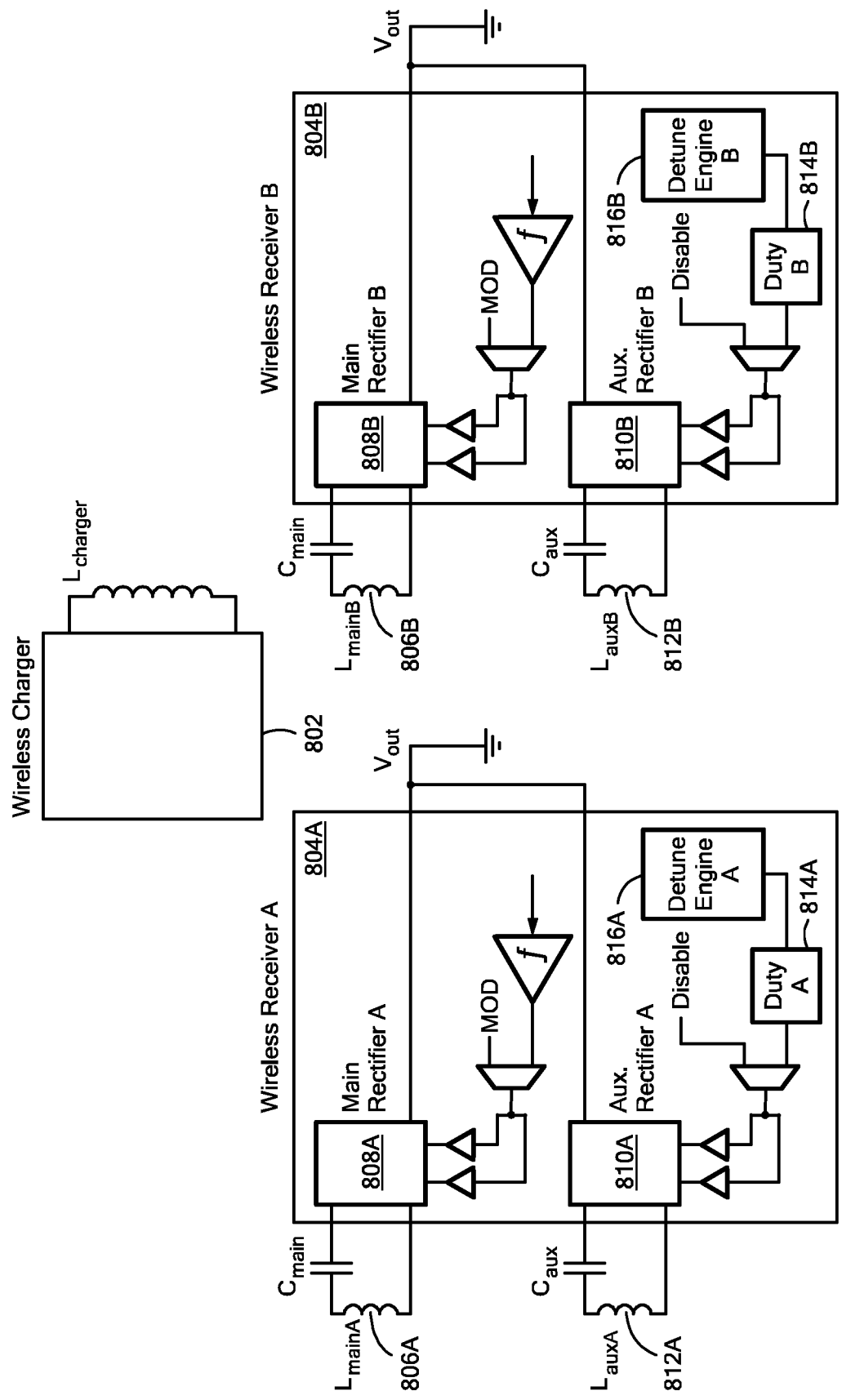
FIG. 8 is a block diagram of an illustrative embodiment of a wireless charger and at least two wireless receivers having detune engines.

FIG. 8 illustrates a block diagram of an illustrative embodiment of a wireless charger and at least two wireless receivers having detune engines. As discussed above with reference to FIGS. 1-3, wireless charger 802 delivers resonant inductive power wirelessly to at least one wireless receiver 804. According to an embodiment, wireless charger 802 may deliver wireless power to two or more wireless receivers 804, with each wireless receiver 804 including a detune engine 816. Detune engine 816 is configured to adjust the resonant frequency of the main inductive element 806 of a wireless receiver 804 in order to change the distribution of wireless power from wireless charger 802 to two or more wireless receivers 804. Detune engine 816 may comprise a processor, microprocessor, random access memory, programmable memory, read-only memory, or any combination thereof—to name a few examples.

According to an embodiment, wireless charger 802 may couple to the inductive elements of two wireless chargers 804 with different coupling coefficients. For example, wireless charger 802 may be coupled to the inductive elements 806A and 812A of wireless receiver A 804A with a first coupling coefficient and coupled to the inductive elements 806B and 812B of wireless charger 804B at a second coupling coefficient.

As wireless charger 802 is coupled to the two wireless chargers 804, if the receivers individually try to maximize their output powers (i.e. adjust the frequency of its respective main coil 806 to match the charging frequency of wireless charger 802), the power delivered by wireless charger 802 is skewed heavily in favor of the nearby receiver. In other words, the receiver in closest proximity ("closest receiver") to the wireless charger will receive many more times the power delivered than the wireless charger in farther proximity ("farther receiver") from the wireless charger.

Adjusting the frequency, or detuning, of the closest receiver 804 can reduce or even reverse the physically imposed asymmetry in the delivered power, and distribute power based on the relative needs of both receivers. The current through the inductive element of wireless charger 802 (e.g. $L_{charger}$) is limited by the closest receiver 804. Adjusting the frequency, or detuning, of the main coil 806 of the closest receiver allows the power output by wireless charger 802 to rise. By raising the power output by wireless charger 804, a larger EMF is introduced on the farther receiver and allows greater power to be delivered to the farther receiver from wireless charger 802.

In some embodiments, each wireless receiver 804 includes a detune engine 816 configured to adjust the frequency of the main inductive element 806 of a wireless receiver 804 to allow greater power to be delivered to a farther receiver. According to some embodiments, detune engine 816 is configured to detect when at least one or more other wireless receivers are within proximity of wireless charger 804. For example, detune engine 804 may be configured to detect when wireless charger 804B is within proximity of wireless charger 804A.

According to some embodiments, detune engine 816 includes a communication engine configured to communicate with a communication engine of at least one other wireless receiver. The communication engine may comprise an antenna, a microprocessor, a processor, an IC, or any combination thereof, to name a few examples. Communication engine of detune engine 816 communicates with a communication engine of at least one other wireless receiver via WIFI, Bluetooth, internet, ethernet, or any combination thereof, to name a few examples. A communication engine of a first wireless receiver may indicate its proximity and power needs to a communication engine at least one other wireless receiver and vice versa. Power needs may comprise a current needed for a load, a voltage needed for a load, a charge state of a load, a capacity of a load, or any combination thereof, to name a few examples.

In other embodiments, detune engine 816 generates an indication signal that is emitted by the main inductive element of its respective wireless receiver 804. The indication signal includes power needs of the wireless receiver and a status of the wireless receiver. The status of the wireless receiver, for example, may comprise data indicating that the wireless receiver is in proximity to a wireless charger and identification information for the wireless receiver. The indication signal emitted by the main inductive element of the wireless receiver is received by an inductive element of wireless charger 802. In some embodiments, the wireless charger may include a storage (comprising for example a RAM, ROM, flash memory, programmable memory, or any combination thereof) that stores indication signals received from wireless receivers.

After receiving an indication signal from a wireless receiver 804, the wireless charger emits at least one other indication signal received from at least one other wireless receiver. For example, wireless charger 802 may receive an indication signal from a first wireless receiver 804 and in response emit an indication signal received from a second wireless receiver. In some embodiments, the wireless charger may emit the received indication signals via the inductive element of wireless charger 802. These emitted received indication signals are then received by at least one wireless receiver in proximity to the wireless charger.

In some embodiments, detune engine 816 is further configured to adjust the resonant frequency of its respective main coil 806 when one or more wireless chargers are detected to be within proximity of wireless charger 804A. As discussed above with reference to FIGS. 1-3, the resonant frequency of main coil 806 may be adjusted according to an impedance presented to its respective auxiliary tank circuit (that includes an auxiliary inductive element 812). Further, as explained above, this impedance presented to the auxiliary tank circuit is controlled by duty cycle control 814.

According to some embodiments, detune engine 816 may generate a duty cycle value based upon the number of receivers within proximity of wireless charger 804. For example, detune engine 816A may generate a duty cycle value which comprises a desired duty cycle for adjusting, or partially detuning, the resonant frequency of main inductive element 806 from a charging frequency when another wireless charger 804 is in proximity. According to some embodiments, the duty cycle value is generated based upon the number of wireless receivers 804 within proximity of the wireless receiver 804, i.e. the duty cycle value is generated based upon adjusting the resonant frequency of the main coil 806 according to the number of wireless receivers 804 within proximity. In other embodiments, the duty cycle value may be generated according to the resonant frequency of the main coil 806 needed to balance the power provided from wireless charger 802 to wireless chargers 804. In other embodiments, the duty cycle value is generated based upon the power needs of the wireless receivers 804 in proximity to wireless charger 802. For example, the duty cycle value may be generated according power needs received by a communication engine from other wireless receivers 804, a received indication signal emitted from a wireless charger 802, or any combination thereof.

Detune engine 816 provides the generated duty cycle value to duty cycle control 814. Duty cycle control 814 is configured to adjust the duty cycle of a coupled auxiliary rectifier 810 according to the provided duty cycle value. For example, duty cycle control 814A is configured to adjust the duty cycle of auxiliary rectifier 810A according to the provided duty cycle value. As the duty cycle of auxiliary rectifier 810 is adjust, so is the impedance seen by the auxiliary tank circuit, as discussed above with reference to FIG. 3. As the impedance presented to the auxiliary tank circuit changes, the resonant frequency of main inductive element 806 is adjust, allowing for main inductive element 806 to be partially detuned.

Figure 9:
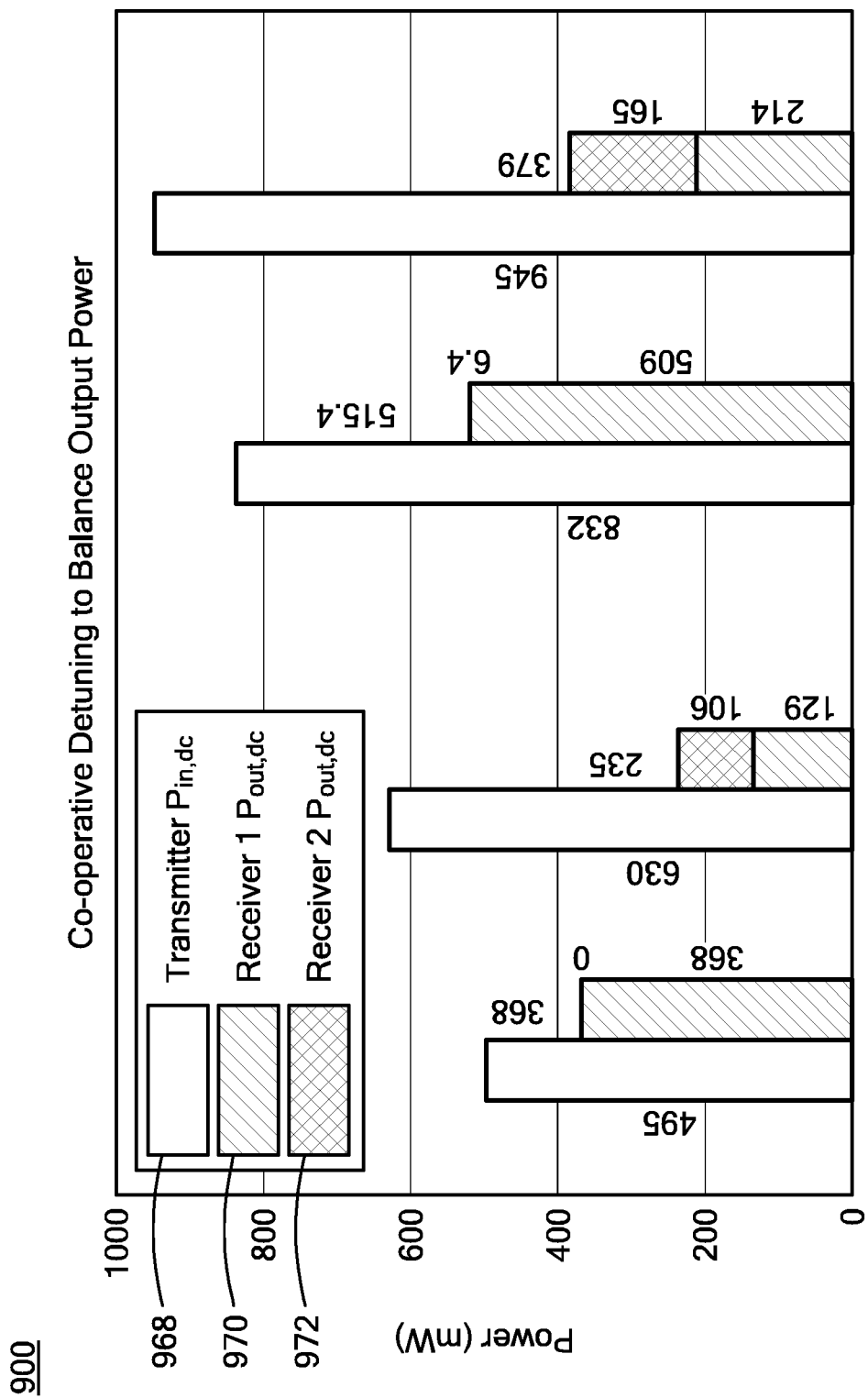
FIG. 9 illustrates a plot, representing power outputs for a wireless charger and two wireless receivers for instances where cooperative detuning does take place and instances where cooperative detuning does not take place over two distances.

FIG. 9 illustrates a plot 900, representing power outputs for a wireless charger 968 and two wireless receivers 970 and 972 for instances where cooperative detuning does take place and instances where cooperative detuning does not take place over two distances. Specifically, the plot shows power numbers for two distance configurations when the receivers don't co-operate and when they do co-operate with the goal of equalizing their individual dc output powers for two separate levels of coupling asymmetry.

Figure 10:
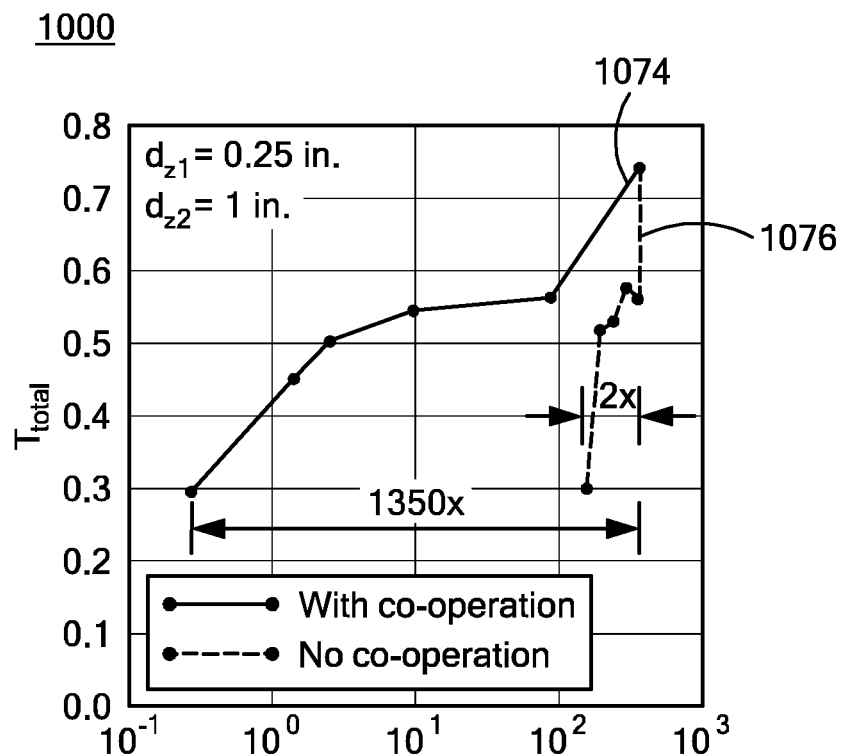
FIG. 10 is a plot, representing the power distribution ratio between power delivered to a first wireless receive and a second wireless charger with a first distance vs the overall power efficiency of the system.
Figure 10A:
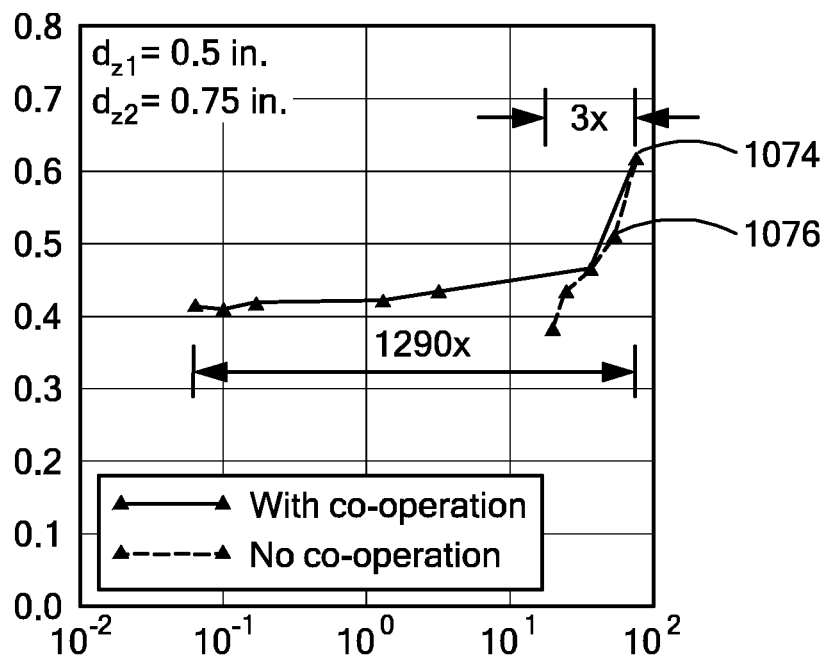
FIG. 10A is a plot, representing the power distribution ratio between power delivered to a first wireless receive and a second wireless charger with a second distance vs the overall power efficiency of the system.

FIG. 10 illustrates a plot 1000, representing the power distribution ratio between power delivered to a first wireless receiver (located 0.25 inches from the wireless charger) and a second wireless charger (located at 1 inch from the wireless charger) vs the overall power efficiency of the system with cooperative power sharing 1074 and without cooperative power sharing 1076. FIG. 10A illustrates a plot, representing the power distribution ratio between power delivered a first wireless receiver (located 0.5 inches from the wireless charger) and a second wireless charger (located at 0.75 inches from the wireless charger) vs the overall power efficiency of the system with cooperative power sharing 1074 and without cooperative power sharing 1076. The plot shows that detuning the closer receiver for power redistribution from the wireless charger allows the asymmetry in power delivery to be reversed even when the two receivers are at distances in a 4:1 ratio away from the charger. In both cases, the total efficiency (ηtotal) is highest when the receivers do not co-operate because most of the power goes to the closer receiver at higher efficiency. By detuning the closer receiver, a more significant fraction of the power can be delivered to the farther receiver at lower ηtotal. Thus, detuning allows for a trade-off between ηtotal and balanced power delivery.

It can also be seen from FIG. 10 that partially detuning the closer receiver using duty cycle control allows the system to achieve intermediate power distribution ratios. This can offer an overall efficiency benefit when compared against time multiplexing the system between the closer receiver being maximally detuned and fully tuned. For example, in the 4:1 asymmetric case shown in FIG. 10, the overall efficiency in achieving a 50-50 energy split between the two receivers is about 42% with partial detuning of the closer receiver. If instead, time multiplexing is chosen to achieve the same energy split, the system must spend 82% of its time with the closer receiver maximally detuned (a state with lower overall efficiency). This leads to a time-averaged overall efficiency of 37%.

All publications and references cited herein are expressly incorporated herein by reference in their entirety.

What is claimed is:

1. A wireless resonant inductive power receiver for cooperative power sharing between two or more wireless resonant inductive power receivers coupled to a wireless resonant power charger having an inductive element resonating at a charging frequency, the wireless resonant inductive power receiver comprising:
    a first inductive element resonating at a resonant frequency; and
    a second inductive element wirelessly coupled to the first inductive element, the second inductive element configured to decrease power, received by the first inductive element from the wireless resonant power charger, by increasing a difference between the charging frequency and the resonant frequency.

2. The wireless resonant inductive power receiver of claim 1, wherein the resonant frequency is based upon an impedance presented to the second inductive element.

3. The wireless resonant inductive power receiver of claim 2, wherein the second inductive element is further coupled to a duty cycle control, the duty cycle control configured to adjust the impedance presented to the second inductive element.

4. The wireless resonant inductive power receiver of claim 3, wherein the duty cycle control is configured to adjust the impedance presented to the second inductive element so that the resonant frequency is equal to a resonant frequency of the wireless charger.

5. The wireless resonant inductive power receiver of claim 3, wherein the duty cycle control is configured to adjust the impedance presented to the second inductive element so that the resonant frequency is not equal to a resonant frequency of the wireless charger.

6. The wireless resonant inductive power receiver of claim 1, wherein the second inductive element is further coupled to an auxiliary rectifier, wherein the impedance presented to the second inductive element comprises an input impedance of the auxiliary rectifier.

7. The wireless resonant inductive power receiver of claim 6, wherein the input impedance of the auxiliary rectifier is based upon a duty cycle of the auxiliary rectifier.

8. The wireless resonant inductive power receiver of claim 1, wherein the first inductive element is further coupled to a main rectifier and the second inductive element is further coupled to an auxiliary rectifier.

9. The wireless inductive power receiver of claim 8, wherein an output of the main rectifier and an output of the auxiliary rectifier are configured to supply power to a load.

10. The wireless inductive power receiver of claim 1, wherein the first inductive element is larger in physical size than the second inductive element.

11. The wireless inductive power receiver of claim 1, wherein the resonant frequency is based upon a capacitance coupled to the first inductive element.

12. The wireless inductive power receiver of claim 1, further comprising a third inductive element wirelessly coupled to the first inductive element.

13. The wireless inductive power receiver of claim 12, wherein the resonant frequency is based upon an impedance presented to the third inductive element.

14. The wireless resonant inductive power receiver of claim 12, wherein the third inductive element is further coupled to a second duty cycle control, the second duty cycle control configured to adjust the impedance presented to the third inductive element.

15. The wireless resonant inductive power receiver of claim 1, wherein the first inductive element is one of a plurality of main inductive elements.

16. The wireless resonant inductive power receiver of claim 15, wherein at least one of the plurality of main inductive elements is coupled to at least one of a plurality of main rectifiers.

17. The wireless resonant inductive power receiver of claim 1, wherein the second inductive element is one of a plurality of auxiliary inductive elements.

* * * * *